(12) United States Patent
Kim et al.

(10) Patent No.: US 12,471,348 B2
(45) Date of Patent: Nov. 11, 2025

(54) SEMICONDUCTOR DEVICE

(71) Applicant: Infineon Technologies Austria AG, Villach (AT)

(72) Inventors: Hyeongnam Kim, Chandler, AZ (US); Mohamed Imam, Chandler, AZ (US); Eric G. Persson, Minnetonka, MN (US); Alain Charles, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 597 days.

(21) Appl. No.: 17/895,122

(22) Filed: Aug. 25, 2022

(65) Prior Publication Data

US 2023/0068822 A1 Mar. 2, 2023

(30) Foreign Application Priority Data

Aug. 26, 2021 (EP) .................................... 21193311

(51) Int. Cl.
*H01L 29/417* (2006.01)
*H10D 62/85* (2025.01)
*H10D 64/00* (2025.01)
*H10D 64/23* (2025.01)
*H10D 64/27* (2025.01)
*H10D 89/60* (2025.01)

(52) U.S. Cl.
CPC ....... *H10D 64/258* (2025.01); *H10D 62/8503* (2025.01); *H10D 64/112* (2025.01); *H10D 64/513* (2025.01); *H10D 89/611* (2025.01); *H10D 89/921* (2025.01); *H10D 89/931* (2025.01)

(58) Field of Classification Search
None
See application file for complete search history.

(56) References Cited

U.S. PATENT DOCUMENTS

| 2006/0175633 A1 | 8/2006 | Kinzer et al. |
| 2010/0155780 A1 | 6/2010 | Machida et al. |
| 2010/0314666 A1 | 12/2010 | Saito et al. |

(Continued)

FOREIGN PATENT DOCUMENTS

| JP | 2010028038 A | 2/2010 |
| WO | 2014174863 A1 | 10/2014 |

*Primary Examiner* — William C Trapanese
(74) *Attorney, Agent, or Firm* — Murphy, Bilak & Homiller, PLLC

(57) ABSTRACT

A Group III nitride transistor cell is provided that includes a Group III nitride-based body, a source finger, a gate finger, and a drain finger extending substantially parallel to one another and positioned on the Group III nitride-based body, the gate finger being arranged laterally between the source finger and the drain finger and including a p-type Group III nitride finger arranged on the Group III nitride body and a gate metal finger arranged on the p-type Group III nitride finger, and a protection diode. The protection diode is integrated into the Group III nitride transistor cell and operable to conduct current in a reverse direction when the Group III nitride transistor cell is switched off. The protection diode is electrically coupled between the source and drain fingers and is positioned on the Group III nitride body laterally between and spaced apart from the gate finger and the drain finger.

15 Claims, 19 Drawing Sheets

(56) References Cited

U.S. PATENT DOCUMENTS

| | | | |
|---|---|---|---|
| 2014/0151749 A1* | 6/2014 | Jeon | .................... H10D 30/475 257/194 |
| 2015/0249151 A1 | 9/2015 | Reiner | |
| 2016/0043208 A1 | 2/2016 | Ikoshi et al. | |
| 2017/0047410 A1 | 2/2017 | Tanaka | |

* cited by examiner

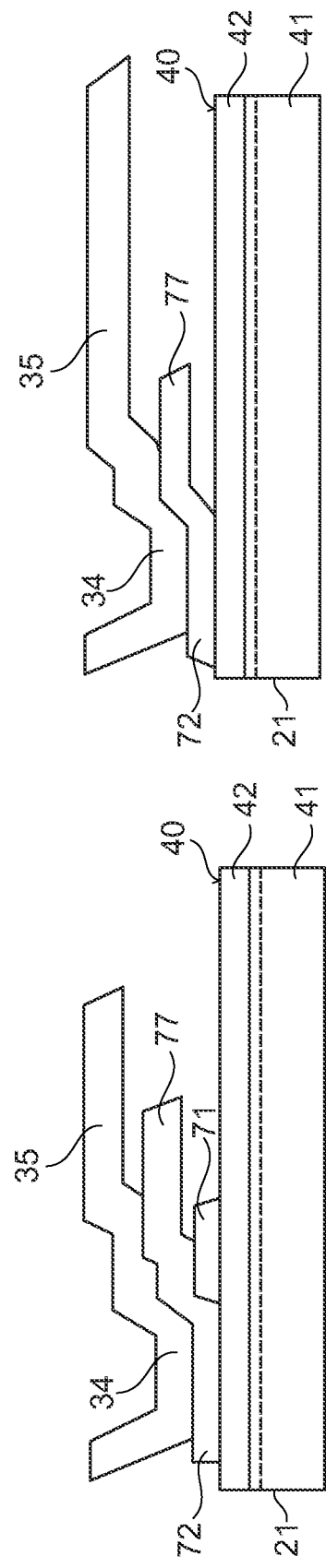
Fig. 4H
Fig. 4I
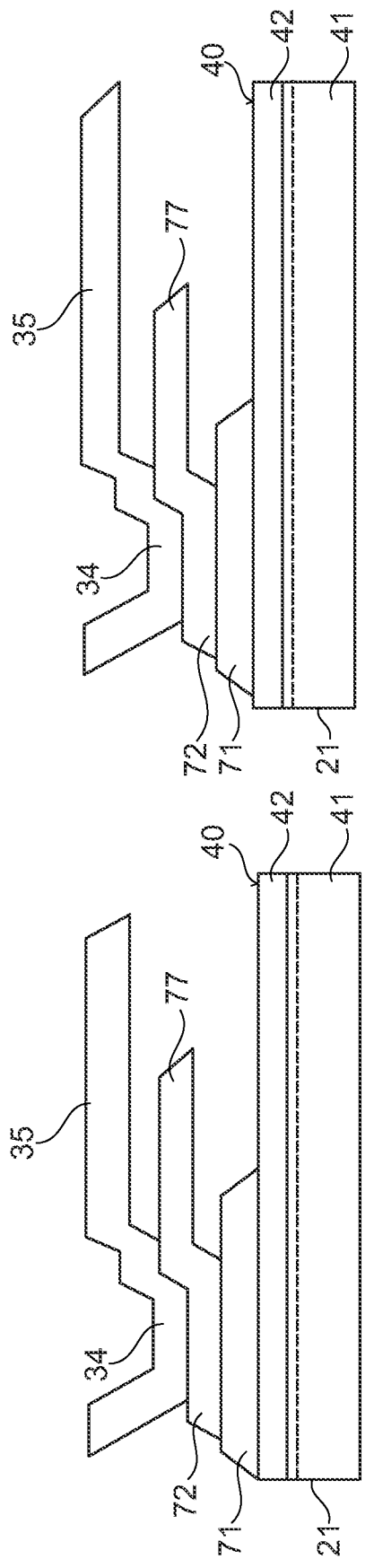
Fig. 4J
Fig. 4K

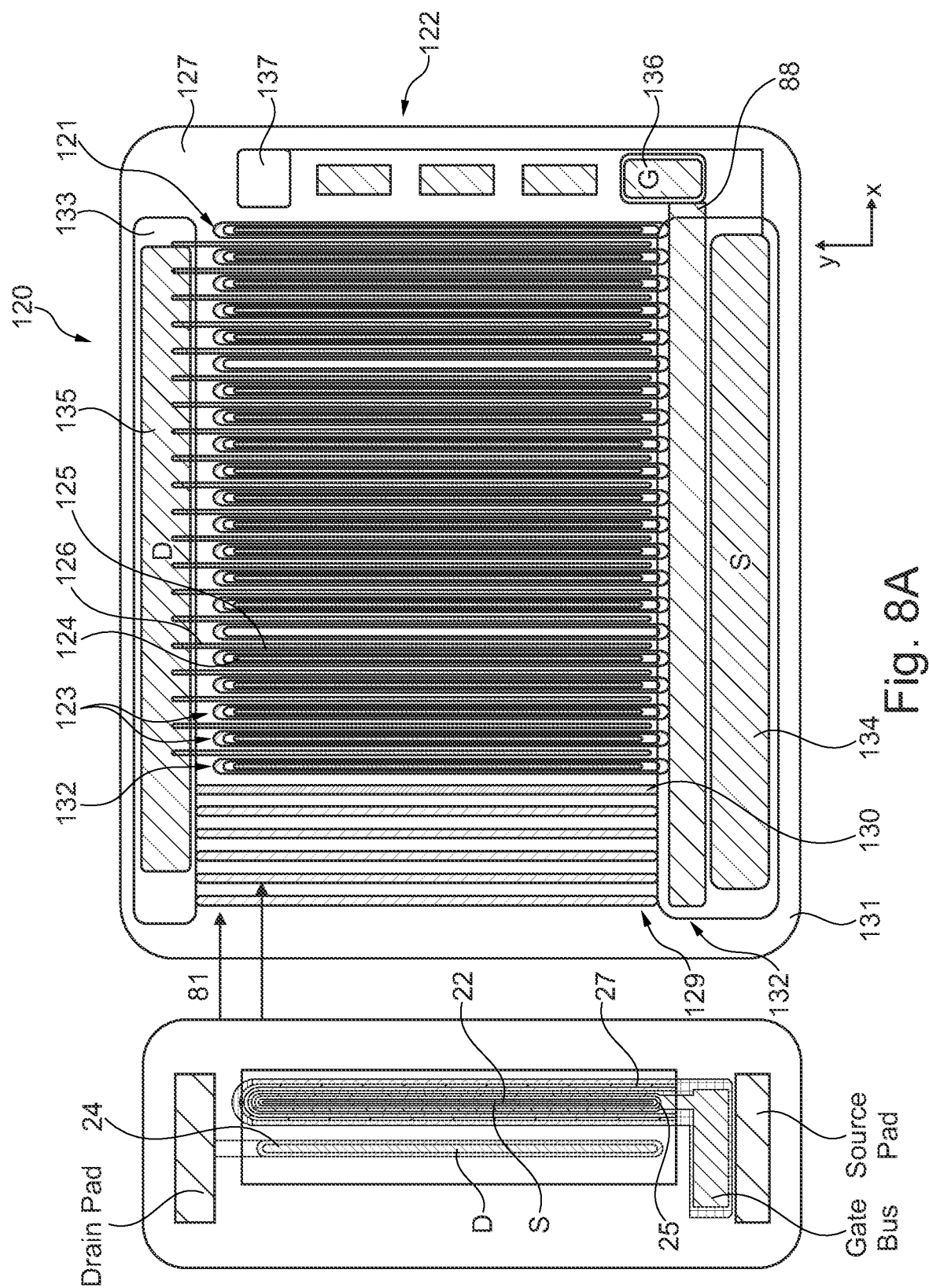

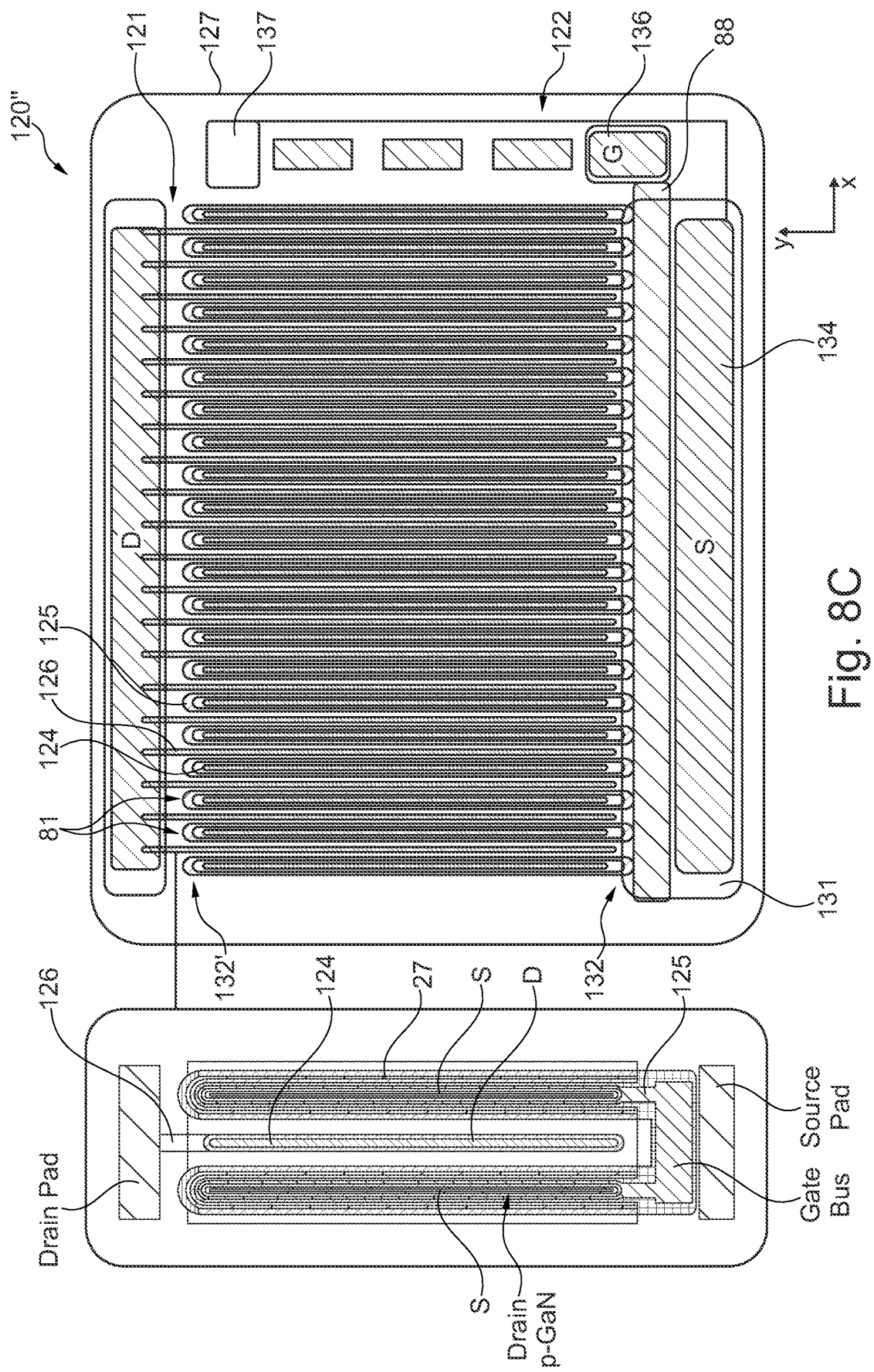

SEMICONDUCTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

Two or more Group III nitride transistor devices may be used to form a circuit such as a half-bridge circuit. In a half bridge circuit, a first Group III nitride transistor provides the low side switch and a second Group III nitride transistor provides the high side switch. It is desirable to improve the reliability of such a half-bridge circuit.

SUMMARY

According to the invention, a Group III nitride transistor cell is provided that comprises a Group III nitride-based body, a source finger, a gate finger and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on the p-type Group III nitride finger, and a protection diode. The protection diode is integrated into the Group III nitride transistor cell and is operable to conduct current in a reverse direction when the Group III nitride transistor cell is switched off. The protection diode is electrically coupled between the source finger and the drain finger and is positioned on the Group III nitride body laterally between and spaced apart from the gate finger and the drain finger.

In some embodiments, the protection diode comprises a Group III nitride island that is positioned laterally between and spaced apart from the gate finger and the drain finger and a metal island that is arranged on the Group III nitride island. The embodiment may be formed using the same process steps that are used to form the gate finger.

In some embodiments, the Group III nitride island of the protection diode is p-type. In some embodiments, the Group III nitride island of the protection diode is undoped. Undoped refers to embodiments, in which the Group III nitride island is not actively doped, for example by implantation of dopants, but may be intrinsically doped.

In some embodiments, the metal island is electrically coupled to the source finger by a source metal layer that extends from the source finger over the gate finger to the metal island. The source metal layer is electrically insulated from the gate finger. The protection diode is electrically coupled between the source finger and the drain finger ad within the area of the transistor cell.

In some embodiments, the metal island extends onto the Group III nitride body at a position between the Group III nitride island and the gate finger.

In some embodiments, in plan view the gate finger has a first straight section and a second straight section and a bent section that is positioned between the first and second straight sections and has a base that is positioned at a greater distance from the drain finger than the first and second straight sections. A protective diode having the form of a Group III nitride island that is positioned laterally between and spaced apart from the gate finger and the drain finger and a metal island that is arranged on the Group III nitride island may be positioned such that the lateral distance between the Group III nitride island and the drain finger is substantially the same as the lateral distance between the straight sections of the p-type Group III nitride finger of the gate finger and the drain finger.

The metal island of the protection diode forms an ohmic contact or a Schottky contact to the Group III nitride island. The metal of the metal island may be selected so as to form either the ohmic contact or the Schottky contact. The Group III nitride island may be p-type or undoped.

In some embodiments, the protection diode comprises a plurality of discrete sections spaced apart at intervals and forming a row that is substantially parallel to the source finger. In this embodiment, the transistor cell includes a plurality of switching sections that alternate or are interleaved with protection sections along the length of the source finger and drain finger.

In some embodiments, the protection diode comprises a Schottky metal layer positioned directly on the Group III nitride body. The Schottky metal layer may have the form of a discrete island that is spaced apart from and laterally between the gate finger and the drain finger.

In some embodiments, the protection diode is elongate and has a strip-like form in plan view such that the Group III nitride island and the metal island each have the form of a finger that extends substantially parallel to the gate finger and the drain finger.

In some embodiments, the source metal layer and/or the metal island further comprises a first extension positioned at a distance from the Group III nitride island and the Group III nitride body-based body and extending towards the drain. The first extension forms a field plate.

In some embodiments, the source metal layer and/or the metal island further comprises a second extension extending from the first extension towards the drain and positioned at a distance from the first extension and the Group III nitride-based body.

In some embodiments, the gate finger further comprises a gate recess in the Group III nitride-based body and the p-type Group III nitride finger has a T-shape in cross-section.

According to the invention, a Group III nitride transistor device is provided that comprises an active area comprising a plurality of basic cells, each basic cell comprising a source finger, a gate finger and a drain finger extending substantially parallel to one another and positioned on a Group III nitride-based body, the gate finger being arranged laterally between the source finger and the drain finger and comprising a p-type Group III nitride finger arranged on the Group III nitride body and a gate metal finger arranged on the p-type Group III nitride finger and at least one transistor cell comprising a protection diode according to any one of the embodiments described herein.

In an embodiment, the at least one cell is arranged in a clamping region that is laterally adjacent the active region.

In an alternative embodiment, the at least one cell is arranged between basic cells in the active area.

In some embodiments, two neighbouring gate fingers form a loop that laterally surrounds a source finger and the protection diode has a U-shape and laterally surrounds the loop formed from the two gate fingers.

In some embodiments, the Group III nitride transistor device further comprises a gate bus and a source pad arranged laterally adjacent a first distal end of the source, gate and drain fingers and a drain pad arranged laterally adjacent the opposing second distal end of the source, gate and drain fingers. The gate bus may be integral with the gate fingers.

In some embodiments, the Group III nitride transistor device further comprises a first gate bus arranged laterally adjacent the first distal end and a second gate bus arranged laterally adjacent the second distal end, wherein the first and second gate buses are integral with the gate fingers, or spaced apart from the gate fingers.

In some embodiments, two neighbouring gate fingers form a loop that laterally surrounds a source finger and the protection diode has form of a loop surrounding the loop formed from the gate fingers and neighbouring protection diodes are coupled by looped connections positioned adjacent the first and second distal ends of the drain finger.

In some embodiments, two neighbouring gate fingers form a loop that laterally surrounds a source finger and the protection diode has form of a loop surrounding the drain finger and neighbouring loops formed from gate fingers are coupled by looped connections positioned adjacent the distal ends of protection diode.

In some embodiments, the source pad and the drain pad are arranged over the cell field.

In some embodiments, the protection diode comprises a gated diode structure, whereby the gate metal finger is electrically coupled to the source finger and provides an anode and the drain finger provides a cathode.

According to the invention, a Group III nitride transistor cell is provided that comprises a Group III nitride-based body, a source finger, a gate finger and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on and forming an ohmic contact or a Schottky contact with the p-type Group III nitride finger and a protection diode. The protection diode is integrated into the Group III nitride transistor cell and is operable to conduct current in a reverse direction when the Group III nitride transistor cell is switched off. The gate finger comprises a switching section and a protection section. The protection section is arranged intermediate the length of the gate finger. In the protection section of the gate finger the p-type Group III nitride finger is electrically coupled to the source finger by a connection layer extending on the Group III nitride-based body between the p-type Group III nitride finger and the source finger. In the protection section the metal gate finger is electrically insulated from the connection layer.

In some embodiments, the Group III nitride transistor cell further comprises two isolation regions spaced apart along the length of the gate finger and arranged such that the p-type Group III nitride finger in the protection section is electrically insulated from the p-type Group III nitride finger in the switching section.

In some embodiments, the metal gate finger is continuous throughout the switching section and the protection section and in the protection section is positioned above and is electrically insulated from the connection layer.

In some embodiments, the gate metal finger extends continuously throughout the switching section and the protection section and the p-type Group III nitride finger is spilt into sections that are spaced apart from one another by an isolation section. One isolation section is positioned between the protection section and the switching section. A first section of the p-type Group III nitride finger positioned in the switching section is spaced apart by a first isolation section from a second section of the p-type Group III nitride finger that is positioned in the protection section, whereby the second section of the p-type Group III nitride finger is electrically coupled to the source finger by the connection layer. In embodiments, in which the protection section is positioned intermediate the length of the gate metal finger, a third section of the p-type Group III nitride finger is spaced apart from the protection section by a second isolation region that is positioned on the opposite side of the protection section from the first isolation section.

In some embodiments, the gate metal finger is positioned only in the switching section and the p-type Group III nitride finger extends continuously throughout the switching section and the protection section, wherein in the protection section the p-type Group III nitride finger is electrically coupled to the source finger by the connection layer.

In some embodiments, the Group III nitride finger comprises two or more discrete sections, wherein a first section is positioned in the switching section and a second section is positioned in the protection section and spaced apart from the first section. The gate metal finger is positioned only in the switching section. In the protection section, the second section of the p-type Group III nitride finger is electrically coupled to the source finger by the connection layer.

In some embodiments, the Group III nitride finger comprises two or more discrete sections, wherein a first section is positioned in the switching section and a second section is positioned in the protection section and spaced apart from the first section. The gate metal finger extends continuously throughout the switching section and the protection section. In the protection section the second section of the p-type Group III nitride finger is electrically coupled to the source finger by the connection layer.

In some embodiments, the gate finger comprises a further switching section and a further gate metal finger, wherein the metal gate finger and the further gate finger are electrically connected by a gate connection layer.

In some embodiments, the gate metal finger is positioned only in the switching section and the p-type Group III nitride finger comprises discrete sections, spaced apart from one another, with one section of the p-type Group III nitride finger arranged in the switching section and another section of the p-type Group III nitride finger arranged in the protection section. In the protection section, the discrete section of the p-type Group III nitride finger is electrically coupled to the source finger by the connection layer. In the switching section, the gate metal finger is arranged on the discrete section of the p-type Group III nitride finger.

In embodiments including two or more switching sections, a discrete section of the metal gate finger is arranged on the section of the p-type Group III nitride finger in each of the switching sections. The discrete sections of the metal gate finger are electrically connected by a gate connection layer.

In some embodiments, the connection layer forms an ohmic contact or a Schottky contact to the Group III nitride body.

In some embodiments, the connection layer forms a Schottky contact to the Group III nitride gate finger.

In some embodiments, the gate metal finger is continuous throughout the switching section and the protection section. In the protection section the metal gate finger is electrically insulated from the connection layer that extends between the p-type Group III nitride finger and the source finger. The gate finger may be electrically insulated from the connection layer by an intervening electrically insulating layer. The connection layer may be arranged on the Group III nitride finger and under the metal gate finger in the protection section.

In some embodiments, the Group III nitride transistor cell further comprises a source metal layer arranged on the source finger, the source metal layer extending over and electrically insulated from the gate finger, and a drain metal layer arranged on the drain finger.

In some embodiments, the Group III nitride transistor cell further comprises a dielectric layer arranged between a side face of the source finger and the connection layer.

The dielectric layer may extend from the source finger to the p-type Group III nitride finger and be in contact with both the source finger and the p-type Group III nitride finger. Alternatively, the dielectric layer may extend from the source finger and be spaced apart from the p-type Group III nitride finger.

In some embodiments, in the protection section, the p-type Group III nitride finger is electrically coupled to the source finger by the connection layer, whereby the connection layer extends between the p-type Group III nitride finger and a source metal layer that is arranged on the dielectric layer and on the source finger. In some embodiments, the connection layer is not in direct contact with the source finger and the connection layer is electrically coupled to the source finger by way of the source metal layer only.

In some embodiments, the drain finger further comprises a p-type region that is coupled to the drain finger.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 4D to 4K illustrate cross-sectional views of different structures of a protection diode.

FIG. 8A illustrates a top view of a Group III nitride transistor device according to an embodiment.

FIG. 8C illustrates a plan view of a Group III nitride transistor device according to an embodiment.

DETAILED DESCRIPTION

Figure 1A:
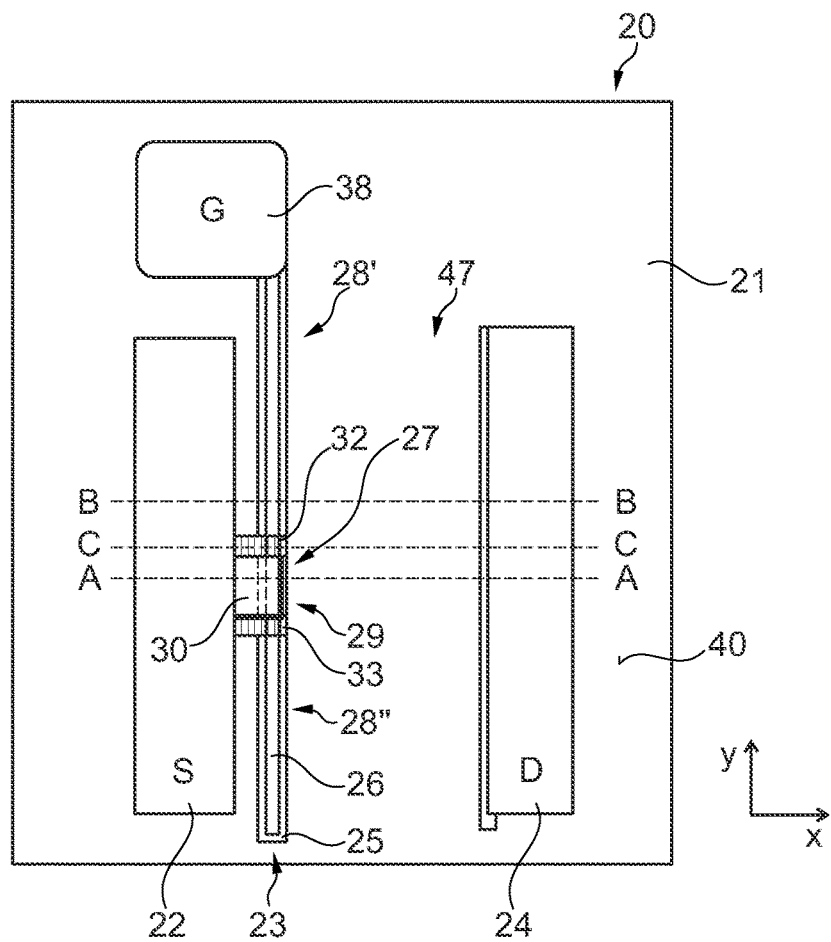
FIG. 1A illustrates a plan view of a Group III nitride transistor cell according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

It is desirable to improve the reliability and reduce the failure rate of Group III nitride transistor devices when used in switching circuits, such as a half bridge circuit in which a first Group III nitride transistor device is used as the low side switch and a second Group III nitride transistor device is used as the high side switch of the half bridge circuit. Without being bound by theory, it is thought that one mechanism which may lead to failure of Group III nitride transistor devices is that during zero voltage switching, the dynamic RDSon becomes high, delaying the discharge process and inducing a positive overshoot of the switch node potential VSW above the DC link voltage VDC when the high side switch of the half bridge circuit is turning on or induces a negative overshoot pulling the switch node potential VSW below 0 V when the low side switch is turning on.

In order to mitigate or even eliminate this problem, it is proposed to include a protection diode to clamp the switch node voltage potential more effectively in order to increase the lifetime of the device. It is proposed to do this by integrating the protection diode within the structure of the transistor and even within a cell of the transistor device. The protection diode may have a gated diode structure having the same threshold voltage as the main Group III nitride transistor device, or may be a Schottky diode based on an enhancement mode Group III nitride structure or a Schottky diode based on a depletion mode Group III nitride structure.

Figure 1B:
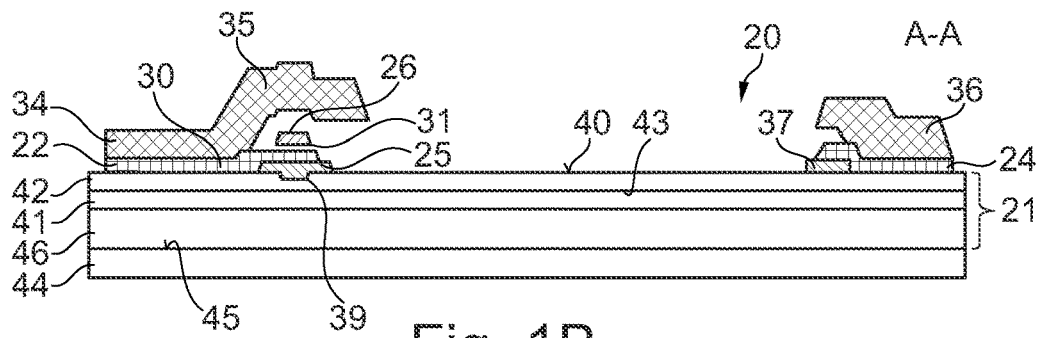
FIG. 1B illustrates a cross-sectional view of the Group III nitride transistor cell of FIG. 1A along the line A-A.
Figure 1C:
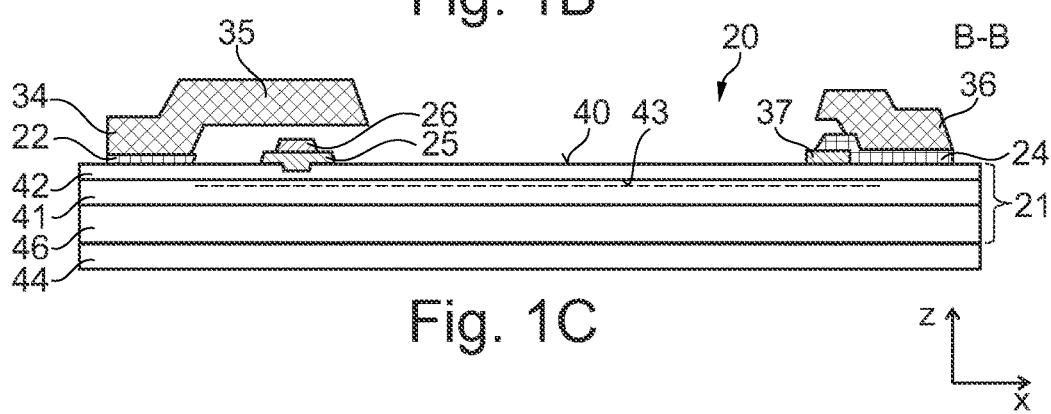
FIG. 1C illustrates a cross-sectional view of the Group III nitride transistor cell of FIG. 1A along the line B-B.

FIGS. 1A through 1C illustrate schematic views of a Group III nitride transistor cell 20 according to an embodiment, whereby FIG. 1A illustrates a top view, FIG. 1B illustrates a cross-sectional view along the line A-A and FIG. 1C illustrates a cross-sectional line view along the line B-B shown in FIG. 1A.

Using the Cartesian coordinate system and as shown in FIGS. 1A through 1C, the plan view of FIG. 1A lies in the x-y plane and the cross-sectional views of FIGS. 1B and 1c in the x-z-plane.

The Group III nitride transistor cell 20 comprises a Group III nitride body 21, a source finger 22, a gate finger 23 and the drain finger 24 which are positioned on the Group III nitride body 21 and which extend substantially parallel to one another in the y direction. The gate finger 23 is arranged laterally between the source finger 22 and the drain finger 24 in the x direction. The gate finger 23 comprises a p-type Group III nitride finger 25 which is arranged on and is in direct contact with the Group III nitride body 21 and a gate metal finger 26 which is arranged on and forms an electrical contact with the p-type Group III nitride finger 25. The gate metal finger 26 may form an ohmic or Schottky contact with the p-type Group III nitride finger 25. The Group III nitride transistor cell 20 further includes a protection diode 27 which is integrated into the Group III nitride transistor cell 20. The protection diode 27 is operable to conduct current in a reverse direction when the Group III nitride transistor cell 20 is switched off. This enables the protection diode to clamp the switch node voltage potential and avoid a positive or negative overshoot of the switch node potential.

The p-type Group III nitride finger 25 may include p-type dopants, for example magnesium. In some embodiments, the Group III nitride transistor cell 20 is an enhancement mode transistor cell and normally off. In alternative embodiments, the Group III nitride transistor cell is a depletion mode transistor cell and normally on.

In some alternative embodiments, the Group III nitride finger is not actively doped but has an intrinsic doping and is n-type. An intrinsically doped Group III nitride finger may be used for fabricating a depletion mode transistor device which is normally on. In some embodiments, the Group III nitride finger is intrinsically doped and has a thickness selected such that the cell is an enhancement mode transistor cell.

In the Group III nitride transistor cell 20, the protection diode 27 is integrated into the gate finger 23. The gate finger 23 comprises a switching section 28 and a protection section 29. The protection section 29 is arranged intermediate the length of the gate finger 23 in the y direction such that two subsections 28', 28" of the switching section 28 are formed. In the protection section 29 of the gate finger 23, the p-type Group III nitride finger 25 is electrically coupled to the source finger 22 by a connection layer 30 which extends on the Group III nitride-based body 21 between the Group III nitride finger 25 and the source finger 22. In the protection section 29, the metal gate finger 26 is electrically insulated from the connection layer 30.

FIG. 1B illustrates a cross-sectional view of the protection section 29 of the gate finger 23 and FIG. 1C illustrates a cross-sectional view along of the switching section 28' of the gate finger 23.

Figure 1D:
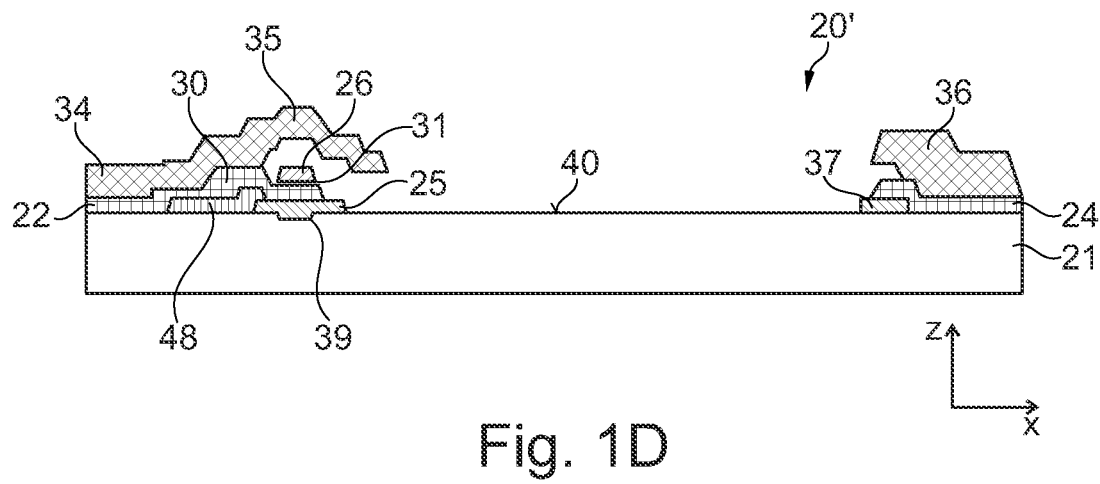
FIG. 1D illustrates a cross-sectional view according to another embodiment.
Figure 1E:
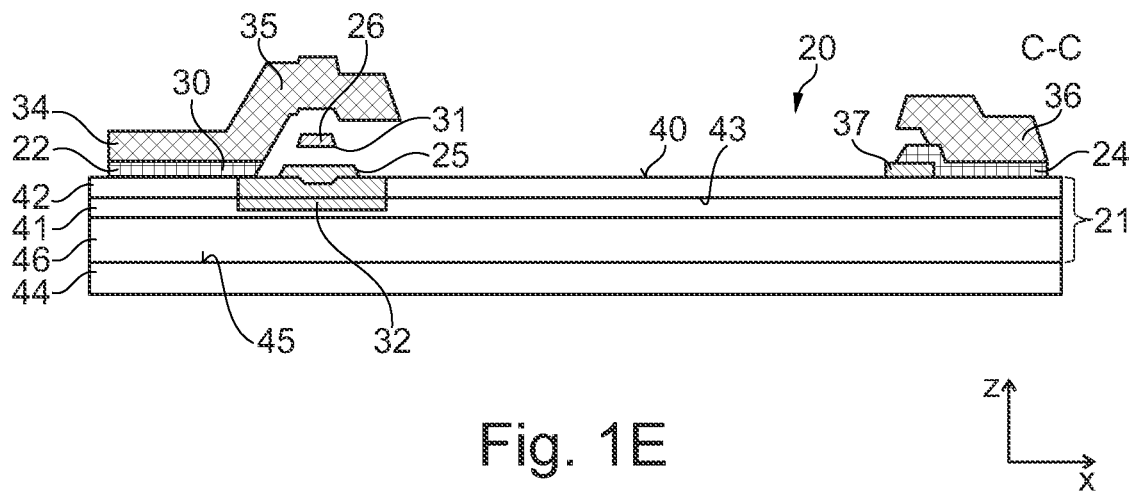
FIG. 1E illustrates a cross-sectional view of the Group III nitride transistor cell of FIG. 1A along the line C-C.

In some embodiments, the p-type doped Group III nitride finger 25 and the metal gate finger 26 are continuous throughout the switching section 28 and the protection section 29 as can be seen in the cross-sectional views of FIGS. 1B, 1C and 1E.

In the protection section 29, the connection layer 30 extends laterally between the source finger 22 and the p-type Group III nitride finger 25 over the upper surface 40 of the Group III nitride body 21. The connection layer 30 is in direct contact with the upper surface 40 and extends into the source finger 22 and is positioned on the upper surface of the p-type Group III nitride finger 25. The connection layer 30 is positioned vertically in the z direction between the metal gate finger 26 and the p-type Group III nitride finger 25 and is positioned directly on and is in electrical contact with the p-type doped Group III nitride finger 25, as can be seen in the cross-sectional view of FIG. 1B. As can also be seen in the cross-sectional view of FIG. 1B, in the protection section 29, the metal gate finger 26 is positioned above the connection layer 30 and is electrically insulated from the connection layer 30 by an intervening isolation layer 31. The protection section 29 provides the protection diode 27.

Since the source finger 22 is electrically coupled to the p-type Group III nitride finger 25 in the protection section 29, the protection section 29 can be considered to provide a gated diode structure for the protection diode 27 that is electrically coupled between the source finger 22 and the drain finger 24. The source/gate provides the anode and the drain finger 24 arranged laterally opposite to the connection layer provides the cathode of the protection diode. The transistor cell can be considered to have an access region 47 which is formed by the region of the Group III nitride body that is positioned between and exposed from the gate electrode 23 and the drain electrode 24. Part of the access region 47 provides the protective diode 27 and the remainder provides the switching region 28 of the transistor cell 20.

In contrast to the arrangement in the protection section 29, in the switching section 28, the metal gate finger 26 is in direct contact with the underlying p-type Group III nitride finger 25, as can be seen in the cross-sectional view of FIG. 1C.

The Group III nitride transistor cell 20 further comprises two isolation regions 32, 33 spaced apart along the length of the gate finger 23 and arranged such that the portion of the p-type doped Group III nitride finger 25 in the protection section 29 is electrically insulated from the portions of the p-type Group III nitride finger 25 in the switching subsections 28', 28". FIG. 1E illustrates a cross-sectional view along the line C-C of the isolation region 32. The isolation regions 32, 33 may be formed by implantation, as indicated by the hashed region in FIG. 1E, and or by a trench filled with insulation material. FIG. 1G illustrates an example of an isolation region in the form of a trench that is filled with insulation material. The distance between the isolation regions 32, 33 defines the length of the protection section 29 in the y direction such that one isolation region 32, 33 is positioned between each switching subsection 28', 28" and the protection section 29 of the gate finger 23.

Figure 1F:
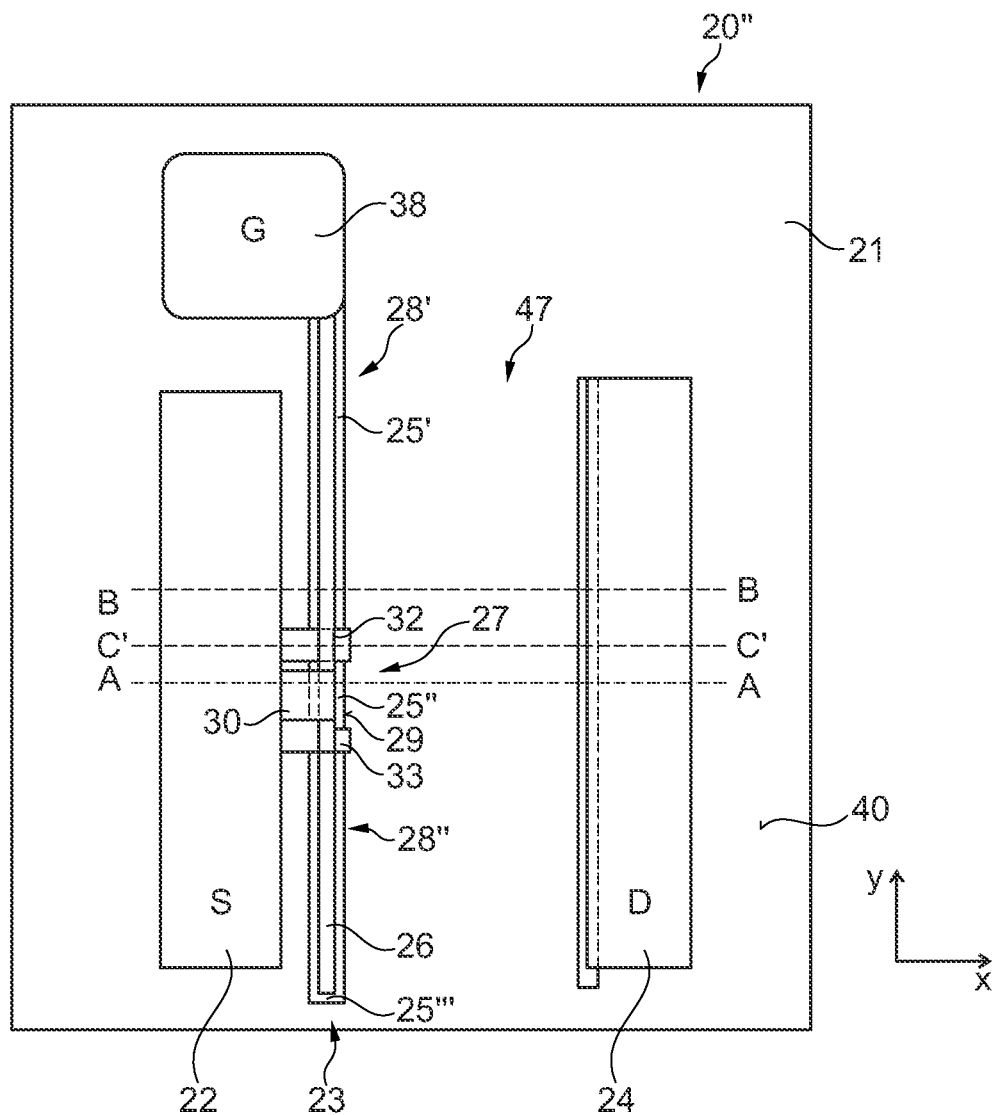
FIG. 1F illustrates a plan view of a Group III nitride transistor cell according to an embodiment.
Figure 1G:
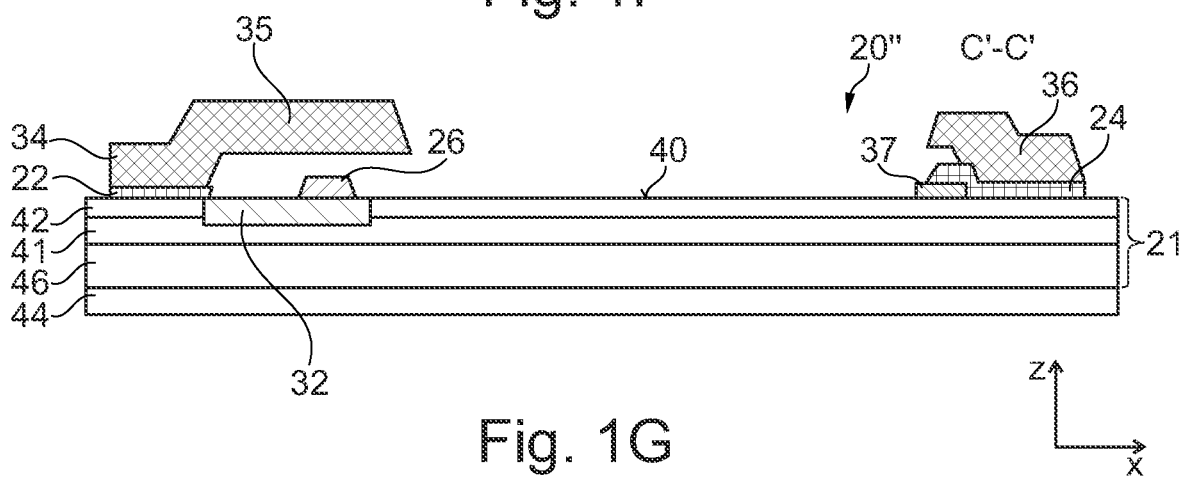
FIG. 1G illustrates a cross-sectional view of a Group III nitride transistor cell of FIG. 1F along the line C'-C' according to another embodiment.

In other embodiments, such as that illustrated in the plan vie of FIG. 1F and the cross-sectional view along the line C'-C' of FIG. 1F, the transistor cell 20' has a p-type Group III nitride finger 25 that comprises three discrete sections 25', 25", 25'". The three sections 25', 25", 25'" extend in a row in the y direction. A first section 25' is positioned in the switching section 28', a second section" is positioned in the protection section 29 and a third section 25'" is positioned in the switching section 28".

The first and second sections 25', 25" of the p-type Group III nitride finger 25 are spaced laterally apart from one another in the y direction by the isolation region 32, as can be seen in the plane view of FIGS. 1F and 1n the cross-sectional view of FIG. 1G. In this embodiment, the isolation regions 32 33 are each formed of a trench filled with insulation material. However, an implanted region could also be used. The second and third sections 25", 25'" of the p-type Group III nitride finger 25 are spaced laterally apart from one another in the y direction by the second isolation region 33.

The second section 25" of the p-type Group III nitride finger is electrically coupled to the source finger 22 by the connection layer 30. In this embodiment, the metal gate finger 26 extends continuously over the switching section 28', the isolation region 32, the protection section 29, the isolation region 33 and the switching section 28". The metal gate finger 26 is electrically isolated from the connection layer 30 by the insulation layer 31 in the protection section 29 and is in contact with the first section 25' and third section 25'" of the p-type Group III nitride finger in their respective switching sections 28', 28", as in the cross-sectional views illustrated in FIGS. 1B and 1C.

The Group III nitride transistor cell 20 further includes a source metal layer 34 which is positioned on and electrically connected to the source finger 22. The source metal layer is not illustrated in FIG. 1A, but can be seen in the cross-sectional view of FIGS. 1B and 1C. The source metal layer has an elongate strip-like form and extends in the y direction along the length of the source finger 22. The source metal layer 34 may also include a field plate extension 35 which extends over and above the gate finger 23. The extension 35 is electrically isolated from the gate finger 23. The extension also has an elongate strip-like form.

In some embodiments, the drain finger 24 further comprises a p-type region 37 which is electrically coupled to the drain finger 24. The p-type region 37 may also have an elongate finger form and extend substantially parallel to the source finger, gate finger 23 and drain finger 24. The p-type region 37 is positioned between the gate finger 23 and the region of the drain finger 34 which is in direct contact with the Group III nitride-based body 21. The drain finger 24 may be positioned at least partly on the p-type doped region 37 in order to electrically couple the p-type region 37 to the drain finger 24.

A drain metal layer 36 is arranged on and electrically connected to the drain finger 24. The drain metal layer 36 is not illustrated in the top view of FIG. 1A but can be seen in the cross-sectional views of FIGS. 1B and 1C. The drain metal layer 36 may have a lateral extent that is similar or the same as the lateral extent of the drain finger 24. The drain metal layer may be positioned above and be spaced apart from the p-type drain region 37.

The gate finger 23 is also electrically coupled to a gate pad 38 which is positioned at the peripheral edge of the Group III nitride cell 20 and laterally adjacent to the switching section 28.

The gate finger 23 may include an elongate recess 39 in the upper surface 40 of the Group III nitride-based body 21 into which the p-type Group III nitride finger 25 extends. The p-type Group III nitride finger 25 may have a T-shape in cross-section as can be seen in the cross-sectional views of FIGS. 1B and 1C. A gate recess 39 and/or the p-type Group III nitride finger 25 may be used to provide an enhancement mode transistor cell.

The source finger 22 and the drain finger 24 may be in direct contact with the Group III nitride upper surface 40 of the Group III nitride-based body 21 and may form an ohmic contact to the Group III nitride-based body 21. The source finger 22, drain finger 24 and metal gate finger 26 may be formed of a metal stack comprising Ti, Al and a capping metal in order to provide an ohmic contact to the Group III nitride body 21 and p-type Group III nitride finger 25, respectively. If a Schottky contact is used for the gate finger 23, the metal of the metal gate finger 26 is selected appropriately. For example, the metal gate finger may be formed of one or more of the group consisting of TiN, Ti, W, $WSi_x$, Ta, TaN, Ni, Pd, Pt and Ir.

The integration of the protection diode 27 into the gate finger 23 is useful in that additional lateral space, either within or adjacent to the transistor cell 20, is not required by the protection diode 27. Furthermore, the protection diode 27 can be fabricated using the same process steps used to fabricate the remaining portions of the transistor cell 20. For example, the connection layer 30 can be fabricated at the same time as the source finger 22 and the drain finger 24, since it is integral with the source finger 22. The insulating layer 31 arranged between the connection layer 30 and the metal gate finger 26 in the protection section 29 may also be fabricated at the same time as further isolation structures of the transistor cell 20.

This arrangement allows the threshold voltage of the protection diode 27 to be substantially the same as the threshold voltage of the transistor cell 20. When the transistor device is used as the low side switch or high side switch in a half-bridge circuit, the protection diode 27 is able to switch on as the high side switch or low side switch is opened and clamp the switch voltage VSW at around the diode turn on voltage. Since this diode turn on voltage is substantially the same as the threshold voltage of the transistor cell, the switch voltage VSW is not increased to a more positive valve due to parasitic dynamic RDSon effects. Note that, during switching and dead time, GaN switches are off by applying negative Vgs in general to avoid any spurious turn-on. So, the peak VSW would be reduced from Vth+abs(Vgs)+Vdc (DC link voltage) without the protection diode to Vth+Vdc with the protection diode in principle.

Consequently, damage to the low side switch or high side switch by injected holes is avoided.

FIG. 1D illustrates an embodiment of the Group III nitride transistor 20' which differs from that of FIG. 1C in the arrangement of protection diode 27 in the protection section 29. FIG. 1D illustrates a cross-sectional view of the protection section 29 in a transistor cell 20' having the general arrangement in plan view corresponding to FIG. 1A.

In the embodiment illustrated in FIG. 1D, a further dielectric layer 48 is provided which is positioned on the gate side edge of the source finger 22 and which extends along the upper surface 40 of the Group III nitride body 21 to the p-type gate finger 26. The conductive connection layer 30 is positioned on and in direct contact with the Group III nitride finger 25 and the dielectric layer 48. The connection layer 30 is, in this embodiment, not in direct contact with the source finger 22. In this embodiment, the source metal layer 34 extends between the source finger 22 and the connection layer 30 and electrically connects the p-type Group III nitride layer finger 25 to the source metal finger 22 in the protection region 29 in order to form the gated diode structure for the protection diode 27. The source metal layer 34 has an extension 35 that is spaced apart from the connection layer 30 at a position above the p-type Group III nitride finger 25 so as to provide a field plate structure.

In some embodiments, the Group III nitride-based body 21 includes a multilayer structure which comprises a Group III nitride channel layer 41 and a Group III nitride barrier layer 42 arranged on the Group III nitride channel layer 41 forming a heterojunction 43 which is capable of supporting a two-dimensional charge gas. The Group III nitride channel layer 41 and the Group III nitride barrier layer 42 comprise differing compositions and differing bandgaps. For example, the Group III nitride channel layer 41 may be formed of gallium nitride and the Group III nitride-based barrier layer 42 may be formed of aluminium gallium nitride. The Group III nitride transistor cell 20 may be a High Electron Mobility Transistor (HEMT).

The Group III nitride-based body 21 may also include a substrate 44 which includes a growth surface 45 which is capable supporting the epitaxial growth of at least one Group III nitride layer. The Group III nitride-based body 21 may further include a buffer structure 46 arranged on the growth surface 45, whereby the channel layer 41 is arranged on the buffer layer 46. The buffer structure 46, the channel layer 41 and the barrier layer 42 may each be formed by epitaxial growth of a suitable Group III nitride layer(s) on the growth surface 45 of the substrate 44. In some embodiments, a transition layer is arranged between the growth surface 45 and the buffer layer 46.

The transition layer, if used, and the buffer layer 46 may each include multiple sublayers. A typical transition and buffer structure for a silicon substrate includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer or $Al_xGa_{(i-x)}N$ back barrier, if present, is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

The substrate 44 is commonly formed of a material other than a Group III nitride and may be called a foreign substrate. The substrate 44 may be formed of silicon and may be formed of monocrystalline silicon or an epitaxial silicon layer, or may be formed of SiC or sapphire.

Figure 2A:
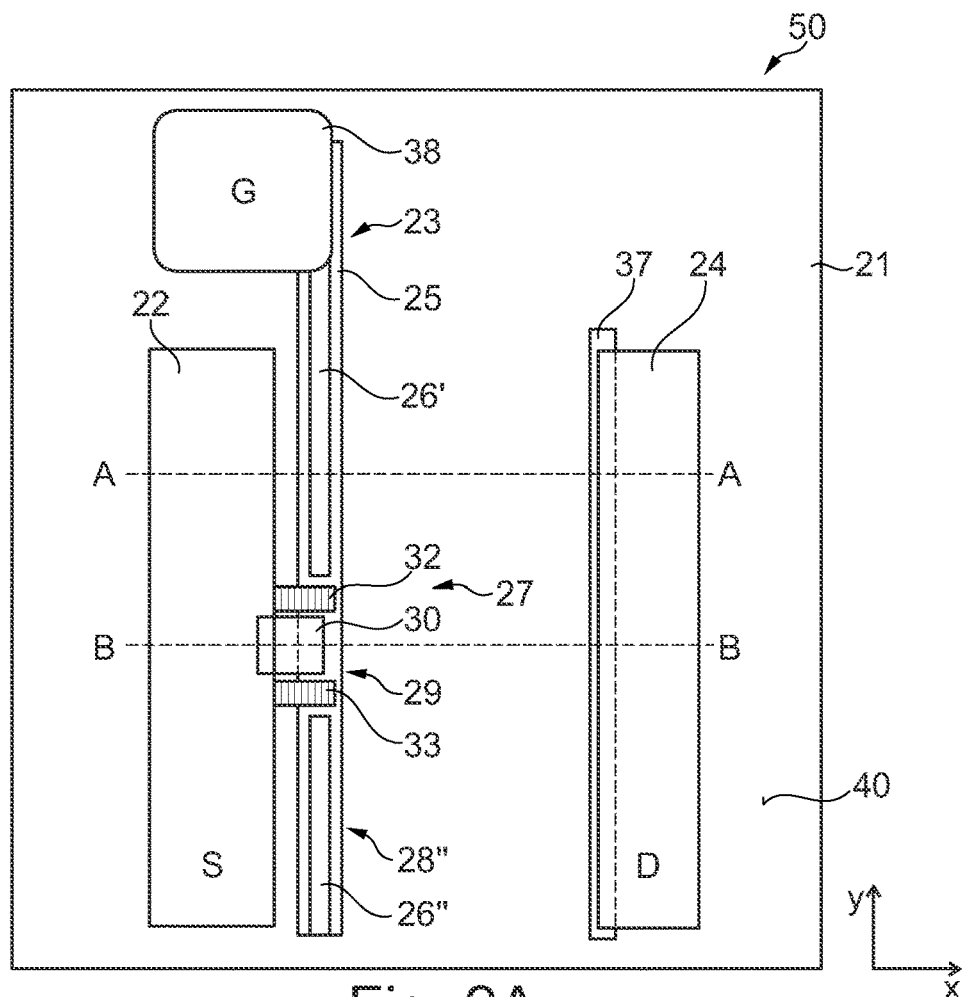
FIG. 2A illustrates a plan view of a Group III nitride transistor cell according to an embodiment.
Figure 2B:
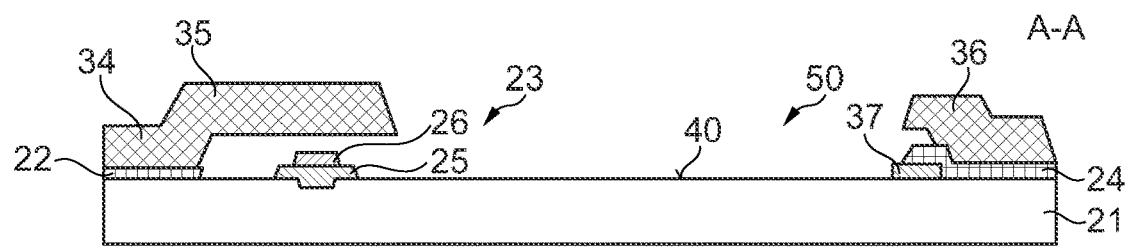
FIG. 2B illustrates a cross-sectional view along the line A-A shown FIG. 2A.
Figure 2C:
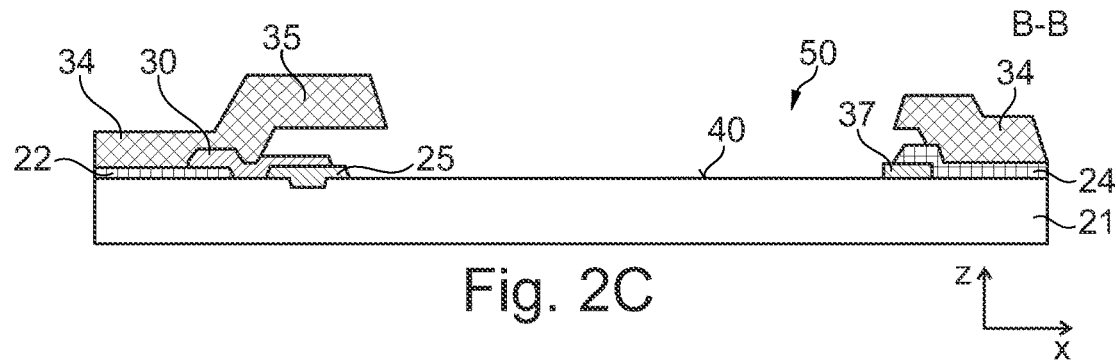
FIG. 2C illustrates a cross-sectional view along the line B-B shown in FIG. 2A.

FIGS. 2A through 2C illustrate a Group III nitride transistor cell 50 according to an embodiment. FIG. 2A illustrates a plan view, FIG. 2B a cross-sectional view along the line A-A and FIG. 2C a cross-sectional view along the line B-B shown in FIG. 2A.

The Group III nitride transistor cell 50 comprises a protection diode 27 which is integrated into the Group III nitride transistor cell 50 and in particular, into the gate finger 23. The gate finger 23 includes a first switching section 28', and a second switching section 28" with the protection section 29 arranged between the first and second switching sections 28', 28" as in the embodiment illustrated in FIGS. 1A through 1G. The protection diode 27 has a gated diode structure.

The Group III nitride transistor cell 50 differs from that illustrated in FIGS. 1A through 1G in the structure of the protection diode 27 and in particular the structure of the metal gate finger 26 and the connection layer 30 between the p-type Group III nitride finger 25 and the source finger 22 in the protection section 29.

Similar to the embodiment described with reference to FIGS. 1B to 1D, the p-type doped Group III nitride finger 25 extends continuously throughout the switching sections 28', 28" and the protection section 29, whereby the portion of the p-type Group III nitride finger 25 positioned in the protection section 29 is electrically isolated from the portions of the p-type Group III nitride finger 25 arranged in the switching sections 28', 28" by isolation regions 32, 33.

Figure 2D:
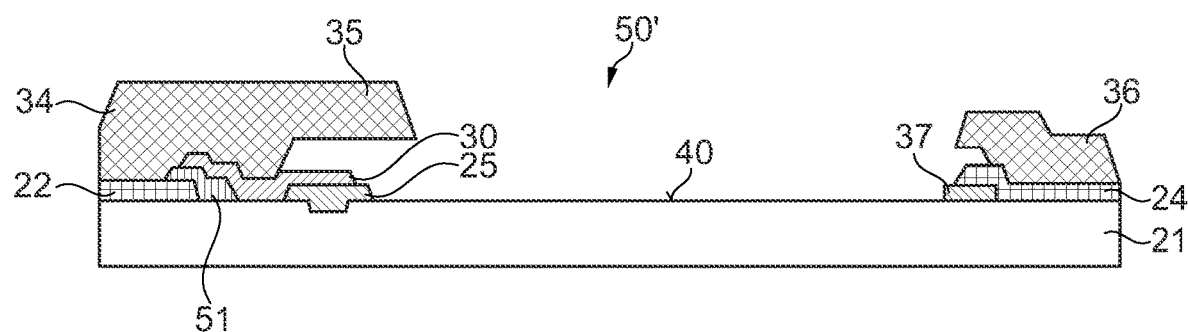
FIG. 2D illustrates a cross-sectional view along the line B-B according to another embodiment.
Figure 2E:
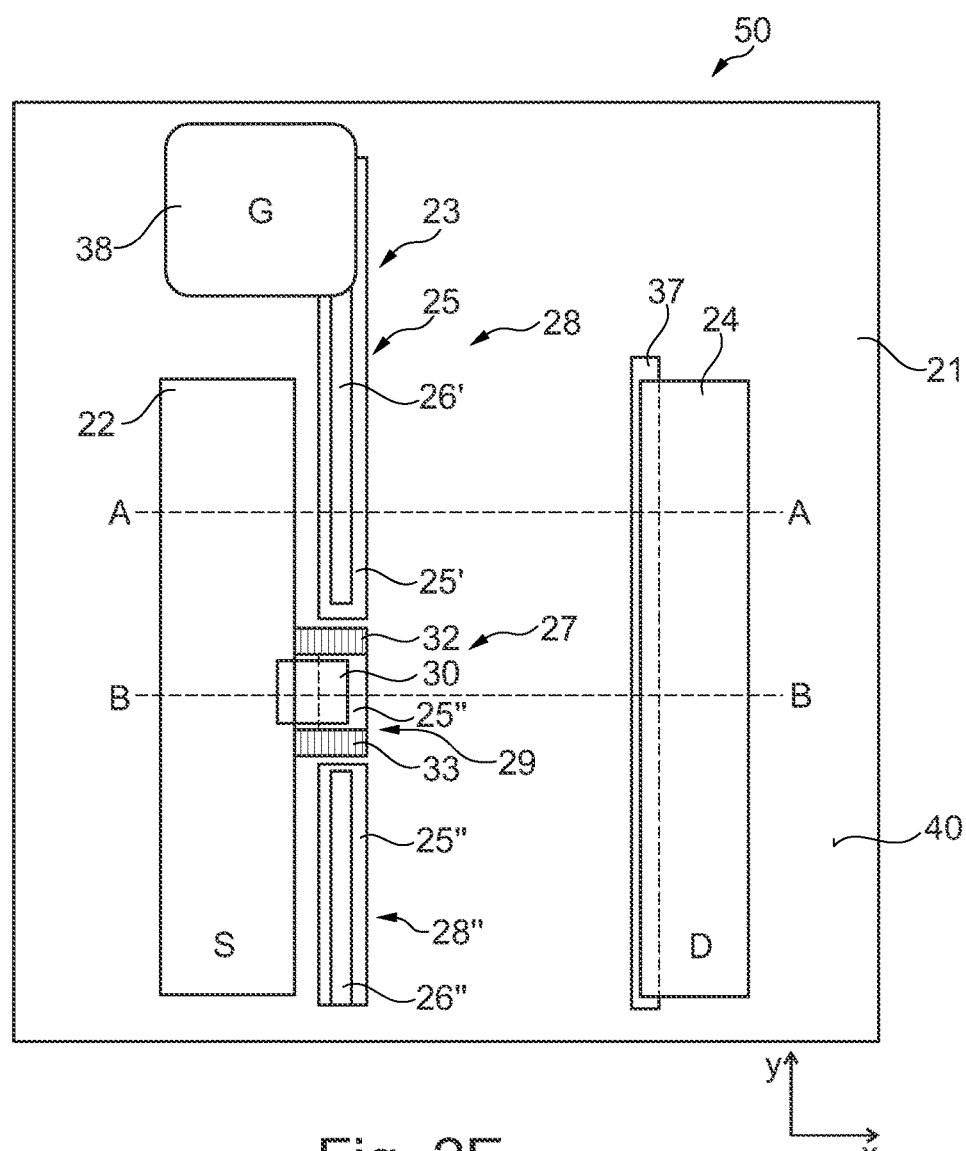
FIG. 2E illustrates a plan view of a Group III nitride transistor cell according to an embodiment.

However, in other embodiments, such as that illustrated in FIG. 2E, the p-type Group III nitride finger comprises discrete subsections 25', 25", 25'" so that the Group III nitride finger is removed from, and not positioned in, the isolation regions 32, 33 formed between the switching sections 28,', 28" and the protection section 29, respectively, similar to the embodiment illustrated in FIGS. 1F and 1G.

In the embodiment illustrated in FIGS. 2A through 2E, the metal gate finger 26 comprises two separate sections. In embodiments including a single continuous p-type Group III nitride finger 25 a first section 26' of the metal gate finger 26 is arranged on the p-type Group III nitride finger 25 in the first switching section 28' and a second section 26" of the metal gate finger 26 which is arranged in the second switching section 28".

In embodiments in which the p-type Group III nitride finger 25 includes multiple discrete subsections, 25', 25", 25'", such as the embodiment illustrated in FIG. 2E, the first section 26' of the metal gate finger 26 is arranged on the first section 25' of the p-type Group III nitride finger 25 in the first switching section 28' and the second section 26" of the metal gate finger 26 is arranged on the third p-type Group III nitride finger 25'" in the second switching section 28".

The two sections 26', 26" of the metal gate finger are electrically connection by a gate connection layer that is positioned in a further metallization layer that is not depicted in FIGS. 2A through 2E. The further metallization layer is arranged vertically above in the z direction the two gate metal sections 26', 26".

As is illustrated in FIG. 2C, in the protection section 29, the p-type Group III nitride finger 25 is electrically coupled to the source finger 22 by a discrete connection layer 30 which is arranged on and in direct contact with the p-type Group III nitride finger 25, the upper surface 40 of the Group III nitride-based body 21 and the source finger 22. In contrast to the arrangement illustrated in FIG. 1B, the connection layer 30 is positioned on the upper surface of the source finger 22. The connection layer 30 may be positioned on only the gate side edge of the source finger so that the remainder of the source finger 22 is uncovered by the connection layer 30.

This connection layer 30 may be formed of the same material as the gate metal finger 26 and may be formed at the same time as the two sections 26', 26" of the metal gate finger 26 but is laterally separate and spaced apart from them. One of the isolation regions 32, 33 is positioned between the connection layer 30 and each of the metal gate finger sections 26', 26". The source metal layer 34 is positioned on both the source metal finger 22 and the source sided end of the connection layer 30 and extends over and above the gate finger 23. The source metal layer 34 has an extension 35 that is positioned vertically above and is spaced apart from the Group III nitride finger 25 and from the connection layer 30 at lateral positions above the p-type Group III nitride finger 25 so as to provide a field plate structure.

As can be seen in the cross-sectional view of FIG. 2B, in the switching sections 28', 28", the metal gate finger 26 is laterally spaced apart from the source finger 22 and the source metal layer 34 extends over and above and is electrically insulated from the underlying metal gate finger 26', 26".

FIG. 2D illustrates an embodiment of the Group III nitride transistor 50' which differs from that of FIG. 2C in the arrangement of the protection diode 27 in the protection section 29. FIG. 2D illustrates a cross-sectional view of the protection section 29 in a transistor cell having the general arrangement in plan view corresponding to FIG. 2A.

In the embodiment illustrated in FIG. 2D, a further dielectric layer 51 is provided which is positioned on the gate side edge of the source finger 22 and extends onto the upper surface 40 of the Group III nitride body 21. The dielectric layer 51 has a laterally extent such that it is positioned in the protection region 29 only and is laterally spaced apart from the p-type gate finger 26. The conductive connection layer 30 is positioned on and in direct contact with the Group III nitride finger 25, the upper surface 40 of the Group III nitride body 21 and the dielectric layer 51. The connection layer 30 is, in this embodiment, not in direct contact with the source finger 22. In this embodiment, the source metal layer 34 extends between the source finger 22 and the connection layer 30 and electrically connects the p-type Group III nitride layer finger 25 to the source metal finger 22 in the protection region 29 in order to form the gated diode structure for the protection diode 27. The source metal layer 34 has an extension 35 that is spaced apart from the connection layer 30 at a position above the p-type Group III nitride finger 25 so as to provide a field plate structure.

In an alternative embodiment, the dielectric layer 51 extends from the gate side edge of the source finger 22 onto the upper surface 40 and to the p-type Group III nitride finger 25 such that in the protection section 29 the region of the upper surface 40 of the Group III nitride body 21 that is arranged between the p-type Group III nitride finger 25 and the source finger 22 in the x direction is covered by the dielectric layer 51.

The connection layer 30 forms an ohmic contact to the Group III nitride body 21 in the protection section 29 in both the arrangements illustrated in FIGS. 2C and 2D. The Group III nitride body 21 may have a multilayer structure and may have the structure according to any one of the embodiments described with reference to FIGS. 1A through 1G.

Figure 3A:
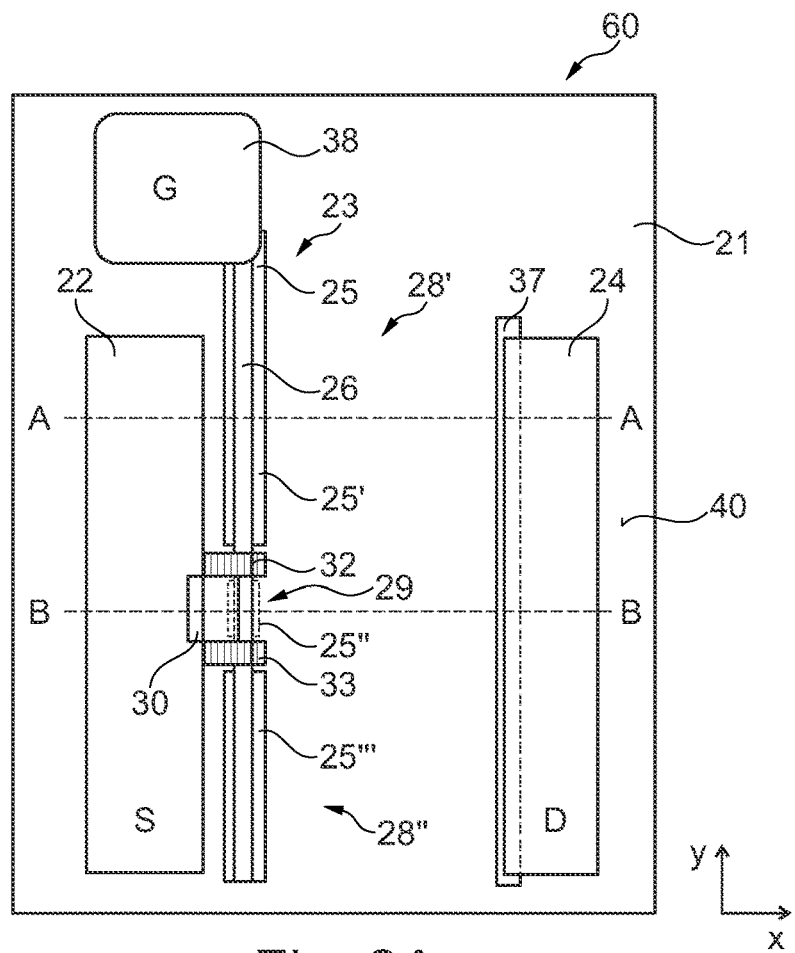
FIG. 3A illustrates a plan view of a Group III nitride transistor cell according to an embodiment.
Figure 3B:
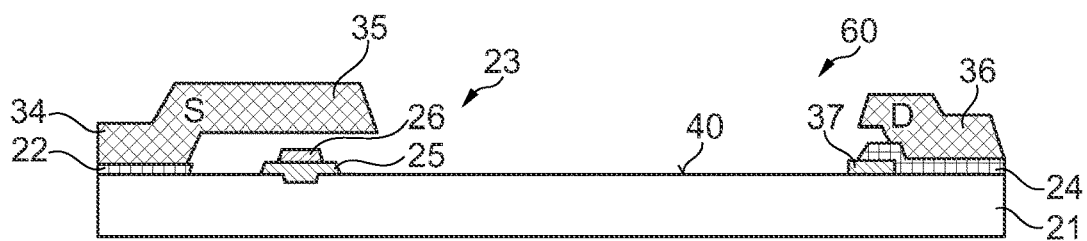
FIG. 3B illustrates a cross-sectional view along the line A-A shown in FIG. 3A.
Figure 3C:
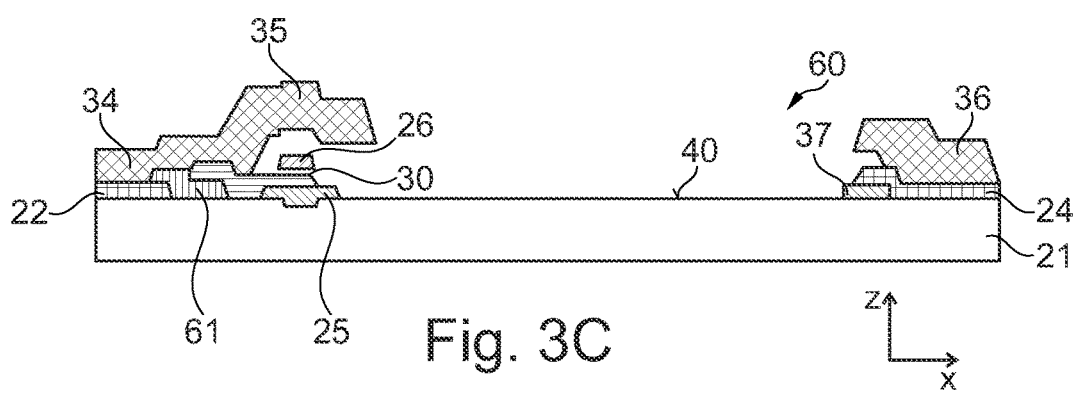
FIG. 3C illustrates a cross-sectional view along the line B-B shown in FIG. 3A.

FIGS. 3A through 3C illustrate schematic views of a Group III nitride transistor cell 60 according to an embodiment, whereby FIG. 3A illustrates a plan view, FIG. 3B a cross-sectional view along the line A-A and FIG. 3C cross-sectional view along the line B-B shown in FIG. 3A.

The Group III nitride transistor cell 60 includes a protection diode 27 that is integrated within the lateral area of the Group III nitride transistor cell 60 and within the gate electrode 23 such that the gate electrode 23 has a first switching section 28' and a second switching section 28" which are separated by a protection section 29. In the embodiment illustrated in FIGS. 3A through 3C, the metal gate finger 26 is continuous throughout both the switching sections 28', 28" and the protection section 29. The p-type Group III nitride finger 25 is spilt into discrete subsections 25', 25", 25'" with the isolation region 32 being arranged between the subsection 25' in the switching section 28' and the subsection 25" in the protection diode section 29 and the isolation region 33 being positioned between the subsection 25" and the subsection 25'" in the second switching region 28" similar to the embodiment illustrated in FIG. 1F. The p-type Group III nitride finger 25 in the protection section 29 is electrically isolated from the p-type Group III nitride finger 25 in the switching sections 28, 28' by isolation regions 32, 33 as in the embodiment described with reference to FIGS. 1A through 1G.

In other embodiments, the p-type Group III nitride finger 25 of the gate finger 23 extends continuously through the switching sections 28', 28" and the protection section 29, similar to the embodiment illustrated in and described with reference to FIG. 1E.

The Group III nitride transistor cell 60 differs from that illustrated in FIGS. 1A through 1G in the structure of the connection layer 30, as can be seen in the cross-sectional view along the line B-B of the protection section 29 illustrated in FIG. 3C.

In this embodiment, a dielectric layer 61 is provided on the gate sided edge of the source finger 22 which extends onto the upper surface 40 of the Group III nitride body 21 but which is spaced apart from the p-type Group III nitride finger 25. The electrically conductive connection layer 30 is positioned in the protection region 29 only between the isolation regions 32, 33 and extends from the p-type Group III nitride finger 25 onto the Group III nitride body 21 and onto the dielectric layer 61. The connection layer 30 is however spaced apart from the source finger 22 by the dielectric layer 61 and is not in direct contact with the source finger 22. The metal gate electrode 26 is positioned above and electrically isolated from the connection layer 30 by an intervening isolation layer 31 as in the embodiment described with reference to FIGS. 1A through 1G.

The source metal layer 34 is positioned on the source finger 22 and on the discrete connection layer 30 so as to electrically couple the p-type Group III nitride finger 25 to the source finger. The source metal layer 34 may also have an extension that extends over the metal gate finger 26 to from a field plate. The source metal layer 34 is electrically insulated from the underlying metal gate finger 26 by an intervening insulation layer.

This embodiment also differs from that illustrated in FIGS. 1C and 2D in that the connection layer 30 forms a Schottky contact with the p-type Group III nitride finger 25 rather than an ohmic contact. The connection layer 30 comprises a metal or an alloy that forms a Schottky contact to the p-type Group III nitride finger 25. The connection layer 30 may comprise one or more of the group consisting of TiN, Ti, W, $WSi_x$, Ta and TaN to provide a Schottky contact.

The Group III nitride body 21 may have a multilayer structure and may have the structure according to any one of the embodiments described with reference FIGS. 1A through 1G.

Figure 4A:
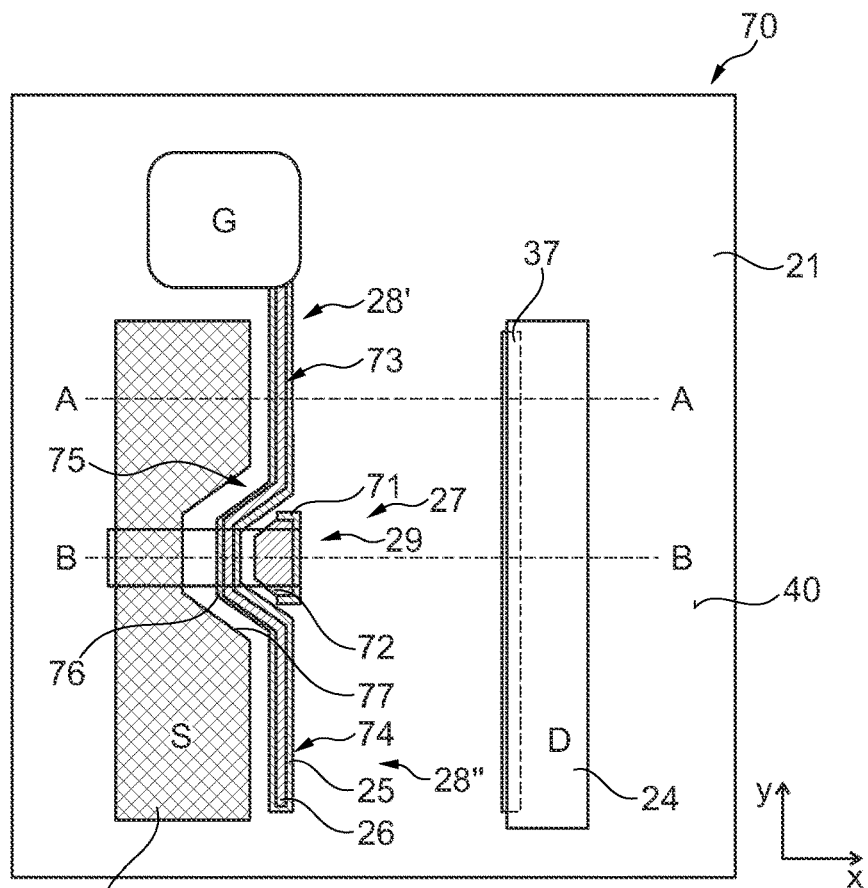
FIG. 4A illustrates a plan view of a protection, Group III nitride transistor cell according to an embodiment.
Figure 4B:
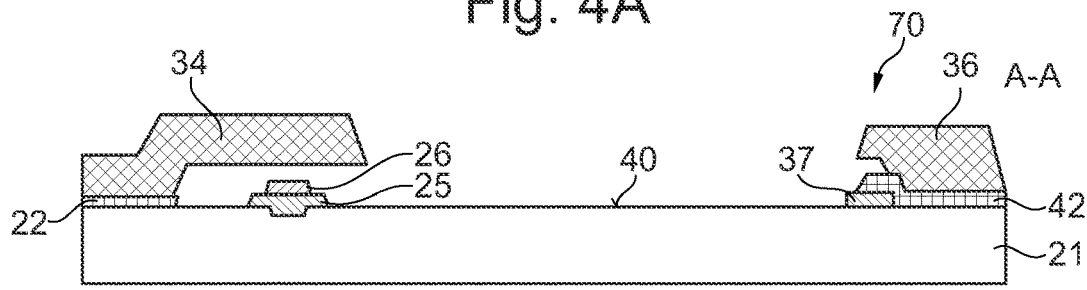
FIG. 4B illustrates a cross-sectional view along the line A-A shown in FIG. 4A.
Figure 4C:
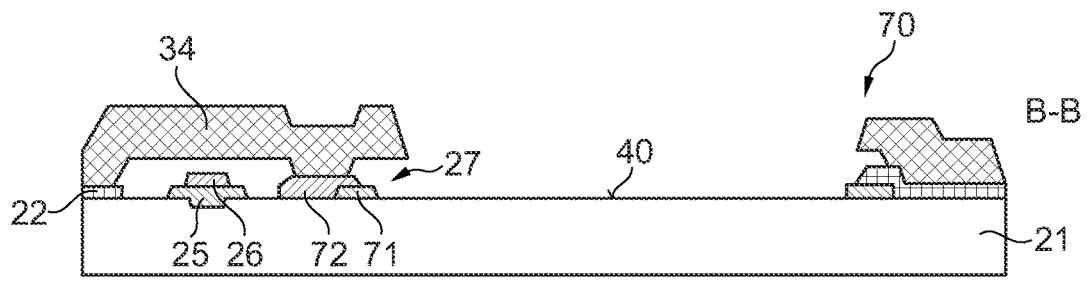
FIG. 4C illustrates a cross-sectional view along the line B-B shown in FIG. 4A.

FIGS. 4A through 4C illustrate enhancement mode Group III nitride transistor cell 70 according to an embodiment, whereby FIG. 4A illustrates a plan view, FIG. 4B a cross-sectional view along the line A-A and FIG. 4C a cross sectional view along line B-B.

The Group III nitride transistor cell 70 comprises a Group III nitride-based body 21, a source finger 22 and a drain finger 24 which extend substantially parallel to one another in the y direction and are positioned on the upper surface 40 of the Group III nitride-based body 21. The gate finger 23 is arranged in the x direction laterally between the source finger 22 and the drain finger 24. The gate finger 23 comprises a p-type Group III nitride finger 25 arranged on the Group III nitride-based body 21 and a gate metal finger 26 arranged on the p-type Group III nitride finger 25. The Group III nitride transistor cell 70 also comprises a protection diode 27 integrated into the Group III nitride transistor cell 70. The protection diode 27 is operable to conduct current in reverse direction when the Group III nitride transistor cell 70 is switched off. The protection diode 27 is electrically coupled between the source finger 22 and the drain finger 24 and is positioned on the Group III nitride-based body 21 laterally between and spaced apart from the gate finger 23 and the drain finger 24.

In the embodiments described with reference to FIGS. 4A through 4K, the protection diode 27 has an island form and is separate from the gate finger 23. The protection diode 27 comprises a Group III nitride island 71 which is positioned laterally between and spaced apart from the gate finger 23 and the drain finger 24 and intermediate the length of the gate and drain fingers 23, 24 in the y direction. Consequently, the transistor cell 70 includes in the y direction a first switching subsection 28', a protection section 29 and a second switching subsection 28". The protection diode 27 further comprises a metal island 72 that is arranged on the p-type Group III nitride island 71. The metal island 72 may form an ohmic contact or a Schottky contact to the p-type Group III nitride island 71 by suitable selection of the metal. The protection diode 27 is electrically coupled to the source finger 22 by the source metal layer 34 which extends from the source finger 22 over the gate finger 23 to the metal island 72. The source metal layer 34 is spaced part from and electrically insulated from the gate finger 23, for example by an electrically insulating layer.

In some embodiments, the Group III nitride island 71 of the protection diode 27 is p-type. In other embodiments, the Group III nitride island 71 of the protection diode 27 is undoped, i.e. is not actively doped but may be intrinsically doped.

The Group III nitride transistor cell 70 therefore includes a protection diode section 29 formed by a portion of the source finger 22 that is electrically coupled to the metal island 72 and a portion of the drain finger 24 which is positioned laterally adjacent the metal island 72 in the x direction in the plan view of FIG. 4A. The Group III nitride transistor cell 70 includes a switching section 28 which is positioned laterally adjacent the protection diode 27in the y direction in the plan view of FIG. 4A. The switching section 28 can be considered to include two subsections 28', 28" which are positioned on opposing sides of the protection diode section 29 in the y direction in the plan view of FIG. 4A.

In the switching section 28, the source metal layer 34 has an extent such that it is positioned above the gate finger 23. in the protection section 29, the source metal layer further extends towards the drain finger 34 so as to be positioned above and in contact with the metal island 72 of the protection diode 27.

As can be seen in the cross-sectional view of the protection section 29 along the line B-B in FIG. 4C, in some embodiments, the metal island 72 extends from the doped Group III nitride island 71 onto the upper surface 40 of Group III nitride-based body 21 at a position between the p-type Group III nitride island 71 and the gate finger 23. The metal island 72 is spaced apart from the gate finger 23 by a region of the upper surface 40 of the Group III nitride body 21.

As can be seen in the plan view of FIG. 4A, in the Group III nitride transistor cell 70, the gate finger 23 has a first straight section 73 and a second straight section 74, which each extend substantially parallel to the source finger 22 and the drain finger 24 and which are aligned with one another in the y direction such that the distance between the first and second straight sections 73, 74 and the drain finger 34 is substantially the same. The gate finger 23 has comprises a bent section 75 positioned between the first and second straight sections 73, 74. The bent section 75 has a base 76 that is positioned at a greater distance from the drain finger 24 in the x direction than the first and second straight sections 73, 74.

The p-type Group III nitride island 71 is laterally spaced apart from the first and second straight sections 73, 74 and spaced apart from the base 76 of the bent section 75.

The p-type Group III nitride island 71 may comprise a width which is substantially the same as the width of the p-type Group III nitride finger 25 in the first and second straight sections 73, 74. The p-type Group III nitride island 71 has an elongate strip-like form that extends substantially parallel to the source finer 22, drain finger 24 and first and second straight sections. The p-type Group III nitride island is spaced apart from the p-type Group III nitride finger 25 in both the straight sections 73, 74 and the bent section 75. The spacing between the gate sided edge of the protection diode 27 and the drain sided edge of the gate finger 23 is substantially uniform.

In other embodiments, the Group III nitride island 71 may be undoped rather than p-type.

The source finger 22 has a recess 77 formed in its gate sided edge that has a shape corresponding to the shape of the bent section 75 of the gate finger 23. The spacing between the gate side edge of the source finger 22 and the source sided edge of the gate finger 23 remains substantially the same along the length of the transistor cell 70.

In some embodiments, the p-type Group III nitride island 71 is laterally aligned with the first and second straight sections 73, 74 of the gate finger 23 in the y direction. The alignment with the straight sections 73, 74 of the gate finger 23 may be used to maintain a similar field distribution as in the p-type Group III nitride finger 25 of the gate finger 23. However, depending on design/voltage rate the p-type Group III nitride island 71 is not aligned in the y direction with the straight sections 73, 74 of the gate finger 23. For example, the p-type Group III nitride island 71 can be inside so that the distance between this p-type Group III nitride island 71 and the p-type region 37 coupled to the drain finger 24 is greater than the distance between the p-type Group III nitride finger 25 and the p-type region 37 coupled to the drain finger 24.

As in the embodiment illustrated in FIGS. 1A to 3C, the drain finger 24 of the Group III nitride cell 70 may also include a p-type Group III nitride region 37 and a drain metal layer 36. The Group III nitride body 21 may have a multilayer structure and may have the structure according to any one of the embodiments described with reference FIGS. 1 to 1G.

FIGS. 4D to 4K illustrate cross-sectional views of different structures which can be used for the protection diode 27 in any of the embodiments described herein.

Figure 4D:
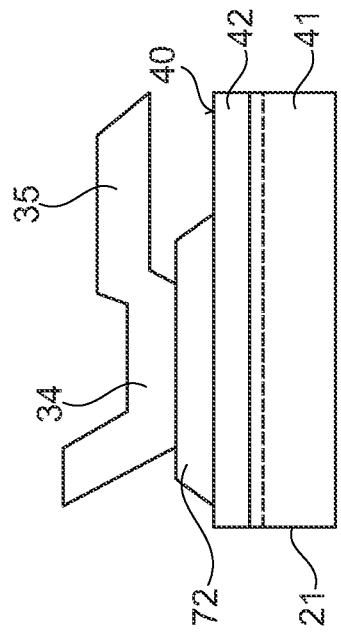

FIG. 4D illustrates a cross-sectional view of a protection diode 27 including a p-type Group III nitride island 71 which may have an elongate strip-like form as in the embodiment illustrated in FIG. 4A. The protection diode 27 includes a metal island 72 which forms a Schottky contact to the p-type Group III nitride island 71 and which is positioned on only a portion of the p-type Group III nitride layer island 71 at the source side edge. The metal island 72 extends over the source side edge of the p-type Group III nitride island 71 onto the upper surface 40 of the Group III nitride body 21. The metal island 71 may be arranged conformally on the source side edge of the p-type Group III nitride island 71. The source metal layer 34 may also be arranged conformally on the metal island 72 and further have an extension 35 which is arranged above and spaced apart from the drain sided edge of the metal island 72 and of the p-type Group III nitride island 71 to form a field plate.

In other embodiments, the Group III nitride island 71 may be undoped rather than p-type.

Figure 4E:
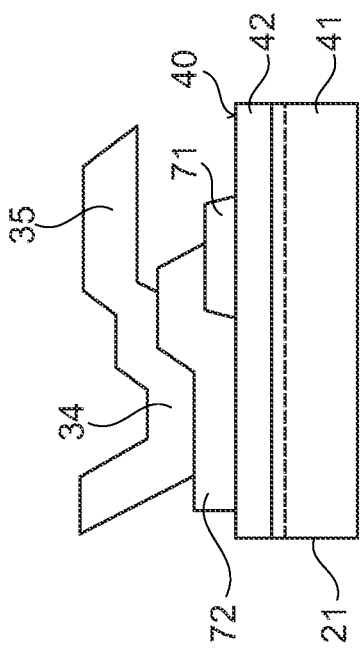

FIG. 4E illustrates a further structure for a protection diode 27 in which the protection diode 27 comprises a metal island 72 only. The metal island 72 is in direct contact with and forms a Schottky contact to the upper surface 40 of the Group III nitride body 21. The metal island 72 may have a lateral shape and form corresponding to the general contour and lateral shape and form of the protection diode 27 illustrated in the plan view of FIG. 4A. The metal island 72 is electrically coupled to the source finger by the source metal layer 34 which extends over and is electrically insulated from the gate finger 23.

Figure 4F:
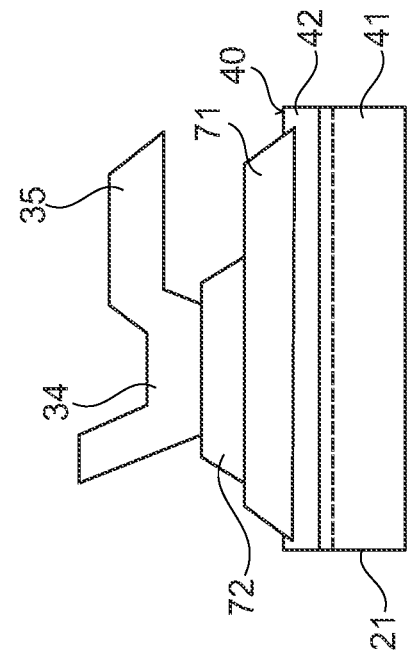

FIG. 4F illustrates a cross-sectional view of a further structure for the protection diode 27 in which the protection diode 27 includes a Group III nitride island 71, which may be p-type or undoped, and a metal island 72. In this embodiment, the metal island 72 has a lateral extent which is smaller than the lateral extent of the Group III nitride island 71 such that the metal island 72 is spaced apart from the Group III nitride-based body 21 and is laterally surrounded on all sides by the peripheral region of the Group III nitride island 71. In this embodiment, the metal island 72 comprises a metal which forms a Schottky contact with the Group III nitride island 71 such that the protection diode 27 is a Schottky diode. The source finger 22 is electrically coupled to the metal island 72 by the source metal layer 34 which extends over and is electrically insulated from the gate finger 23.

Figure 4G:
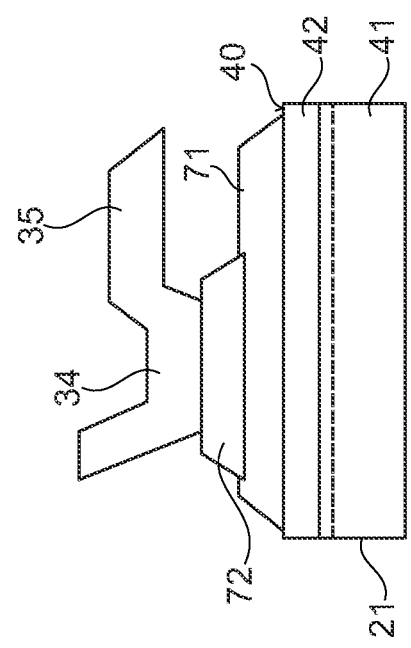

FIG. 4G illustrates a cross-sectional view of further structure for the protection diode 27 which includes a Group III nitride island 71, which may be p-type or undoped, and a metal island 72, which is positioned on the Group III nitride island 71 and which has a lateral extent which is less than the lateral extent of the Group III nitride layer 71 as in the embodiment illustrated in FIG. 4F. In this embodiment, the metal of the metal island 72 is selected so as to provide an ohmic contact with the underlying Group III nitride island 71 such that the protection diode 27 is a PN diode. The source finger 22 is electrically coupled to the metal island 72 by the source metal layer 34 which extends over and is electrically insulated from the gate finger 23.

In each of the embodiments illustrated in FIGS. 4A to 4G, the source metal layer 34 may include an extension 35 which is positioned above and spaced apart from the drain sided edge of the metal island 72 and the Group III nitride island, if present. The extension 35 forms a field plate.

FIGS. 4H to 4K illustrate further embodiments for the protection diode 27 in which a second field plate is provided. FIG. 4H illustrates an embodiment of the protection diode 27 which is similar to that illustrated in FIG. 4D but in which the metal island 72 includes an extension 77. The extension 77 extends in the direction of the drain finger 24 over the drain sided edge of the Group III nitride island 71 and is positioned above and spaced apart from the Group III nitride island 71 at the drain sided edge to form a first field plate structure. The source metal layer 34 is positioned conformally on the source sided edge region of the metal island 72 and also includes an extension 35 which is positioned above the spaced apart from the drain sided edge of the extension 77 that forms the first field plate. The extension 35 of the source metal layer 34 extends over the drain-sided edge of the extension 77 in the direction of the drain finger 24 to provide a second field plate.

FIG. 4I illustrates a structure for a protection diode 27 which includes a single metal Schottky island 72 which is positioned in direct contact with the Group III nitride body 21 similar to that described with reference to FIG. 4E. The metal Schottky island 72 has an extension 77 which extends in the direction of the drain finger 24 and which is positioned above and spaced apart from the upper surface 40 of the Group III nitride-based body 21 to provide a first field plate. The source metal layer 34 is positioned on the metal island 72 and on the gate sided edge of the extension 77 and itself includes an extension 35 which is positioned above and spaced apart from the drain sided edge of the extension 77 and which extends in the direction of the drain finger 24 to provide a second field plate.

FIG. 4J illustrates a protection diode 27 similar to that illustrated in and described with reference to FIG. 4F in which the metal island 72 is spaced apart from the Group III nitride body 21 by a p-type Group III nitride island 71. The metal island 72 also includes an extension 77 which extends in the direction of the drain finger 24 and which is spaced apart and above the drain sided edge of the Group III nitride island 71 to form a field plate. Again, the source metal layer 34 is positioned on the metal island 72 and the gate sided edge of the extension 77 and includes an extension 35 that is positioned above and spaced apart from the drain sided edge of the metal island extension 77 to form a second field plate.

FIG. 4K illustrates a cross-sectional view of a protection diode 27 forming a PN diode. The metal island 72 of the protective diode 27 forms an ohmic contact to the underlying Group III nitride island 71. The metal island 72 also includes an extension 77 which extends from the metal island 72 in the direction of the drain finger 24 and which is positioned above and spaced apart from the drain sided edge of the Group III nitride island 71. The source metal layer 34 is positioned on the metal island 72 and also includes an extension 35 positioned above the drain sided edge of the extension 77 to provide a second field plate.

The protection diode 27 may have different designs and various arrangements within the Group III nitride transistor cell. Figured 5A through 5C illustrate respective plan views of three embodiments in which the protection diode 27 has the form of an island.

Figure 5A:
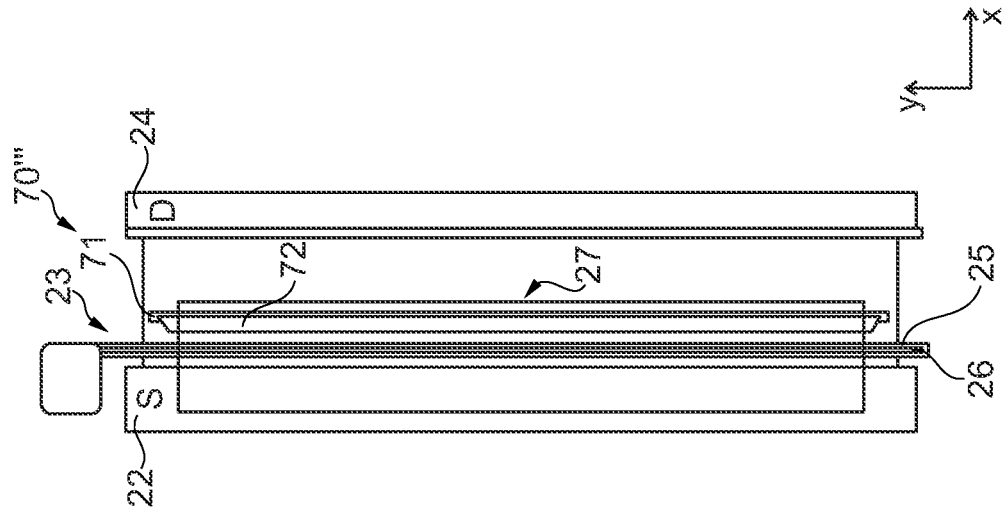
FIG. 5A illustrates a plan view of a Group III nitride transistor cell according to an embodiment.

FIG. 5A illustrates a plan view of a Group III nitride transistor cell 70' which includes a plurality of protection sections 29, which are spaced apart at intervals along the length of the transistor cell 70' in the y direction of the plan view of FIG. 5A. In the embodiment illustrated in FIG. 5A, each protection section 29 includes a protection diode 27 having an island structure as illustrated in FIG. 4A. Consequently, the gate finger 23 includes a bent section 75 which is spaced at a greater distance from the drain finger 24 extending in the x direction for each of the island structures. The bent sections 75 are connected by straight sections 73, 74 that extend substantially parallel to the source finger 22 and drain finer 24. The bent sections 75 are spaced at intervals along the length of the gate finger 23 in the y direction. The source finger 77 also has a recess 77 in the gate sided edge for each of the protection diodes 27 so that the recesses 77 are spaced apart in the y direction along the length of the source finger 22. The metal island 72 of each of the protection diodes 27 is electrically coupled to the source finger 22 by a portion of the source metal layer 34 which extends over and is electrically insulated from the bent sections 75 of the gate finger 23. The protection diode 27 is not limited to the structure shown in FIG. 4A and may have the form of any of the embodiments illustrated in FIGS. 4C to 4K.

Figure 5B:
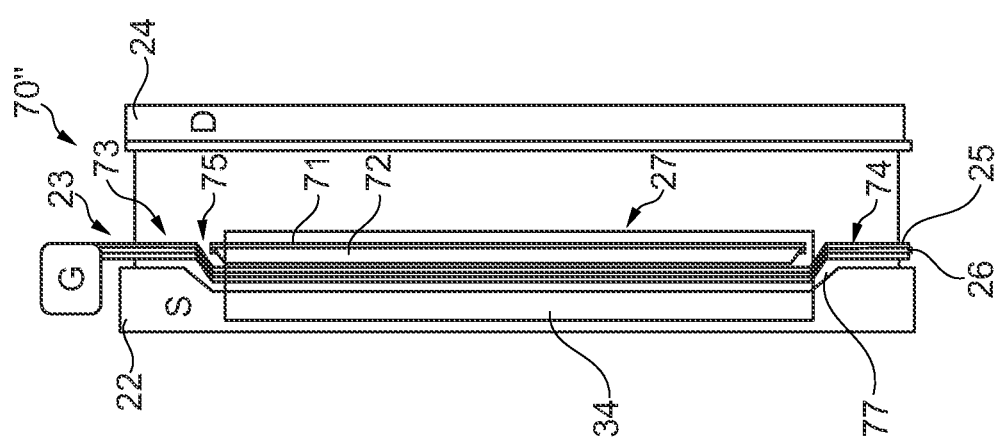
FIG. 5B illustrates a plan view of a Group III nitride transistor cell according to an embodiment.

FIG. 5B illustrates a plan view of a Group III nitride transistor cell 70" which includes a single protection diode 27. This single protection diode 27 has an elongate strip like island form which extends in the y direction over a larger portion of the length of the transistor cell 70", for example at least 60% of the length of the gate finger 23. The gate finger 23 includes a single bent section 75 with the base 76 extending substantially parallel to the source finger 22 and the drain finger 24 and at a greater distance in the x direction from the drain finger 24 compared to the distance between the straight sections 73, 74 and the drain finger 24. The straight sections 73, 74 are arranged at the opposing ends of the bent section 76. The strip-like metal island 72 is electrically coupled to the source finger 22 by a portion of the source metal layer 34 having a length in the y direction is substantially the same as the length in the y direction of the metal island 72. The source metal layer 34 extends over and is electrically insulated from the bent section 75 of the gate finger 23.

Figure 5C:
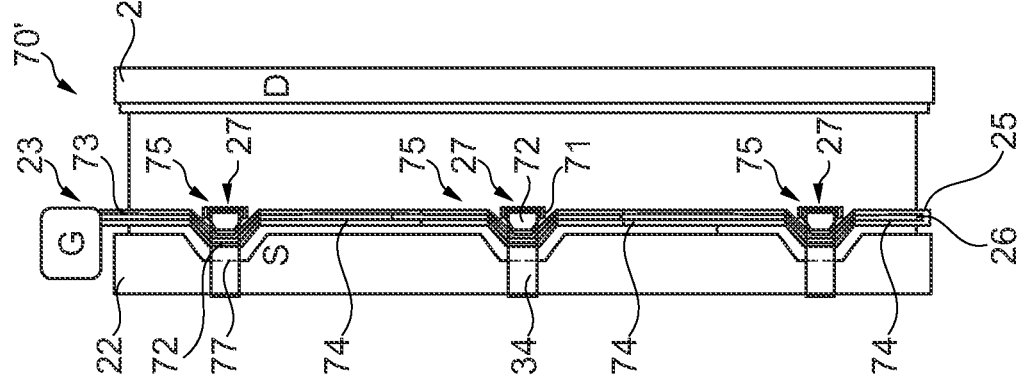
FIG. 5C illustrates an embodiment of a Group III nitride transistor cell according to an embodiment.

FIG. 5C illustrates an embodiment of a Group III nitride transistor cell 70''' in which the protection diode 27 has the form of an island which is positioned between laterally between the gate finger 23 and the drain finger 24. In the Group III nitride transistor cell 70''', the gate finger 23 is elongate and has a straight strip-like form along its entire length. The island form of the protection diode 27 also has an elongate strip-like form and extends substantially parallel to the source finger 22, the gate finger 23 and the drain finger 24 in the y direction. The strip-like metal island 72 is electrically coupled to the source finger 22 by a portion of the source metal layer 34 that has a length in the y direction which is substantially the same as the length in the y direction of the metal island 72.

In the embodiments illustrated in FIG. 5A to 5C, the protection diode 27 may have the structure illustrated in any one of the embodiments of FIGS. 4C to 4K.

Figure 6A:
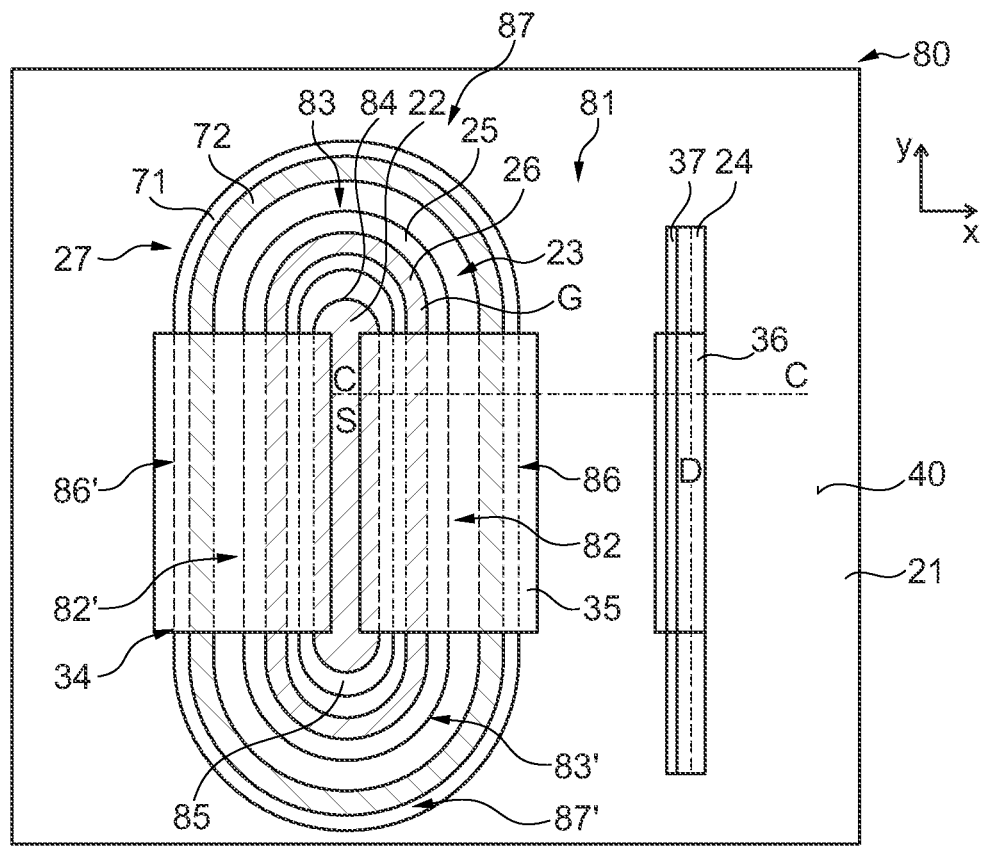
FIG. 6A illustrates a plan view of a cell of the Group III nitride-based transistor.
Figure 6B:
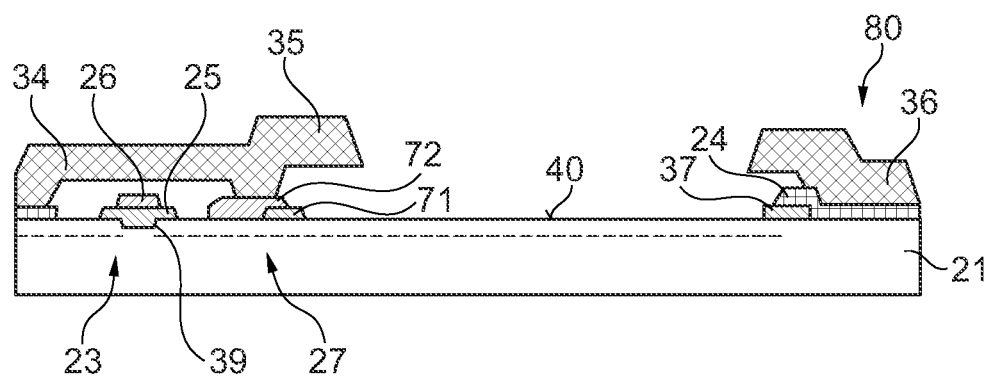
FIG. 6B illustrates a cross-sectional view along the line C-C shown in FIG. 6A.
Figure 6C:
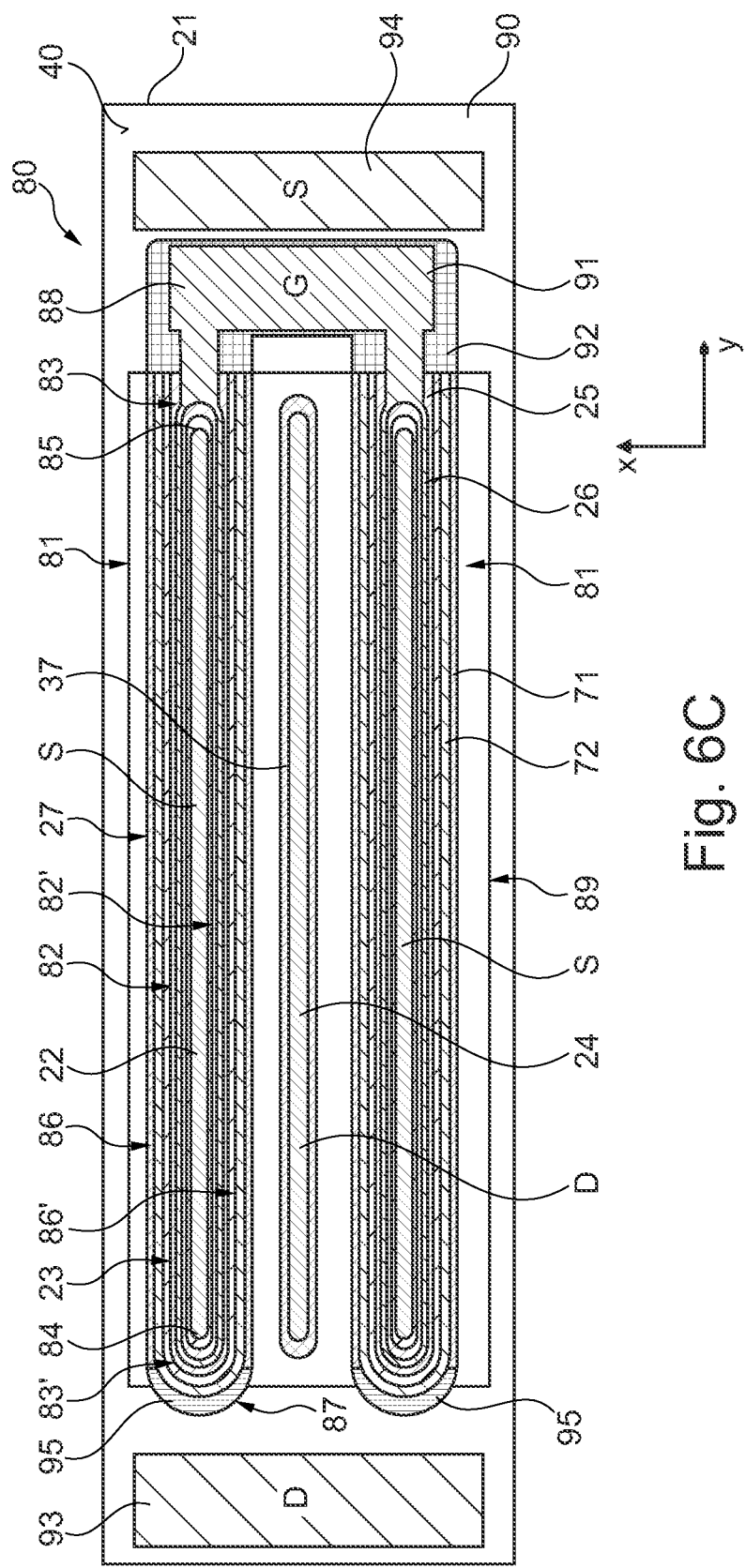
FIG. 6C illustrates a plan view of a transistor device with multiple cells having the arrangement shown in FIG. 6A.

FIGS. 6A through 6C illustrate a Group III nitride-based transistor device 80 according to an embodiment, whereby FIG. 6A illustrates a plan view of a cell 81 of the Group III nitride-based transistor 80, FIG. 6B illustrates a cross-sectional view along the line C-C indicated in FIG. 6A and FIG. 6C illustrates a plan view of multiple cells 81 of the Group III nitride transistor device 80.

As can be seen in the top view of FIG. 6A, the source finger 22 and the drain finger 24 with the p-doped region 37 are arranged on the upper surface of the Group III nitride body 21 and each have a strip-like elongate form and extend substantially parallel to one another in the y-direction. The gate finger 23 has a race track type form in plan view and comprises two straight sections 82, 82', which are arranged adjacent opposing sides of the source finger 22 and extending substantially parallel to the source finger 22 and two curved sections 83, 83', one arranged adjacent each of the opposing distal ends 84, 85 of the source finger 22 and extending between the two straight sections 82, 82' such that the gate finger 23 has a continuous uninterrupted race track form in plan view.

The Group III nitride transistor cell 81 also includes a protection diode 27 which also has a race track type form in plan view. The protection diode 27 surrounds the gate finger 23 such that it is positioned between and spaced apart from the gate finger 23 and the drain finger 24. The spacing between the protection diode 27 and the gate electrode 23 is substantially uniform. Consequently, the protection diode 27 also includes two straight sections 86, 86' that are arranged adjacent the straight sections of the gate finger 23. The two straight sections 86, 86' of the protection diode 27 are connected by two curved sections 87, 87', one positioned at each of the opposing distal ends 84, 85 of the source finger, to form a continuous loop having the rack track form in the top view.

As can be seen in the cross-sectional view of FIG. 6B, the gate finger 23 includes a recessed gate structure and comprises a p-type Group III nitride finger 25 that is arranged in the recess in the Group III nitride body 21 and has a T-shape in cross-section and a metal gate finger 26 that is arranged on the p-type Group III nitride finger 25. However, in other embodiments, the protection diode 27 may have a structure corresponding to the cross-sectional arrangement of any one of the embodiments described herein.

In FIGS. 6A and 6B, the protection diode 27 is illustrated as having a p-type Group III nitride structure 71 and a metal structure 72, each having a race track form in plan view. The metal structure 72 is positioned on the p-type Group III nitride structure 71 and extends onto the upper surface 40 of the Group III nitride-based body 21 at a position between the p-type Group III nitride structure 71 and the gate finger 23. The source metal layer 34 extends from the source finger 22 in two opposing directions such that it is positioned above and electrically insulated from the straight sections 82, 82' of the gate finger 23 and is in contact with the straight sections 86, 86' of the protection diode 27 in order to couple the metal structure 72 of the protection diode 27 to the source finger 22.

FIG. 6C illustrates a plan view of the Group III nitride transistor 80 which shows two transistor cells 81 with two source fingers 22 positioned on opposing sides of a common drain finger 24. The transistor device 80 may include a plurality of such arrangements. One gate finger 23 having an oval racetrack shape shown in FIG. 6A is provided for each source finger 22. The gate electrodes 23 extend into and are electrically coupled together by a gate bus 88 that is positioned adjacent and spaced apart from the first distal end 85 of the source finger 22 and laterally outside active area or cell field 89 in a peripheral edge region 90 of the upper surface 40 of the Group III nitride body 21. The gate bus 88 extends in the x direction and substantially perpendicularly to the length of the source finger 22 and is also spaced apart from the first distal end 85 of the drain finger 24.

Each transistor cell 81 includes a protection diode 27 which has a U-shape in plan view with two straight sections 86, 86' that extend substantially parallel to the straight sections 82, 82' of the gate electrode 23, respectively, and a single curved section 87 that extends between the two straight sections 86, 86' at the second distal end 85 of the source finger 22. The protection diode 27 has an open end at the first distal end 84 of the source finger and has a U-shape in plan view. The protection diode 27 includes a U-shaped p-type Group III nitride structure 71 and a U-shaped metal structure 72 on the p-type Group III nitride structure 71. The gate fingers 23 extend through the open side of the U-shaped protection diode 27 into the gate bus 88.

The gate bus 88 includes a metal gate bus 91 which extends into and is integral with the metal gate fingers 26 and a p-type Group III nitride bus 92 which extends into and is integral with the p-type Group III nitride gate finger 25 and the p-type Group III nitride structure 71 of the protection diode 27.

The drain finger 24 is electrically coupled to a drain bus 93 that is arranged laterally adjacent and spaced apart from the opposing distal end 84 of the source finger 22 and drain finger 24 by a drain metal layer. A source bus 94 is arranged laterally adjacent the gate bus 88 at the periphery of the edge region 90 by a source metal layer. The source metal layer, which is not shown in FIG. 6C, extends from the source bus 94 over the gate bus 88 and is electrically connected to the source finger 22 and the metal island 72 of the protection diode 27 and is electrically insulated from the gate bus 88 and the gate finger 23. The drain finger 24 is electrically connected by a drain metal layer, which is not illustrated in FIG. 6C, to the drain bus 93.

The p-type Group III nitride region 92 which is positioned under the metal gate bus 91 in the edge region 90 and laterally adjacent the active area 89 of the transistor cells 81 depletes the two-dimensional electron gas formed in the Group III nitride body 21 underneath such that this area is normally off. This may be achieved by implantation or a recess structure similar to the recess 39 used under the metal gate finger 26. The region of the p-type Group III nitride finger 25 that is positioned laterally adjacent the gate recess 39 also does not deplete the underlying two-dimensional electron gas so that this region under the p-type Group III nitride finger 25 can be described as a normally on region. The region of the Group III nitride body 21 under the gate recess 39 is normally off.

The curved section 87 and open end of the protection diode 27 lie outside of the active area 89 and are also implanted and/or positioned in a recess such that these regions 95 provide electrical isolation between the two straight sections 86, 86' of the protection diode 27 positioned on opposing sides of the source finger 22 and between the straight sections 86, 86' of the protection diode 27 and the drain bus 93. The p-type Group III nitride structure 71 of the protection diode 27 does not deplete the underlying two-dimensional electron gas so that this region can be described as a normally on region. The active area 89 may be electrically isolated from the peripheral region 90 of the transistor device 80 by implantation or by the use of a recess.

Figure 7A:
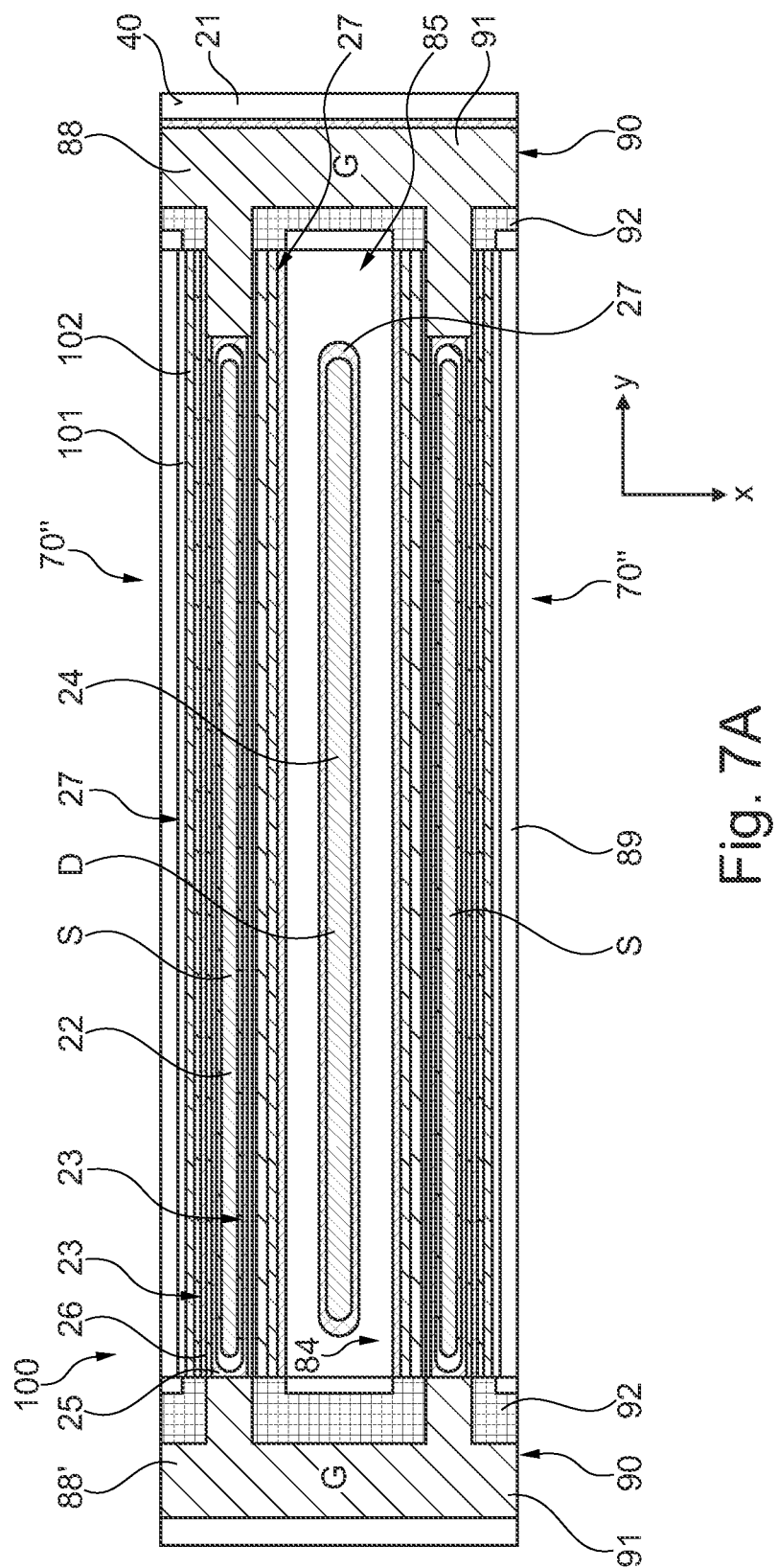
FIG. 7A illustrates top views of a Group III nitride transistor device according to an embodiment.
Figure 7B:
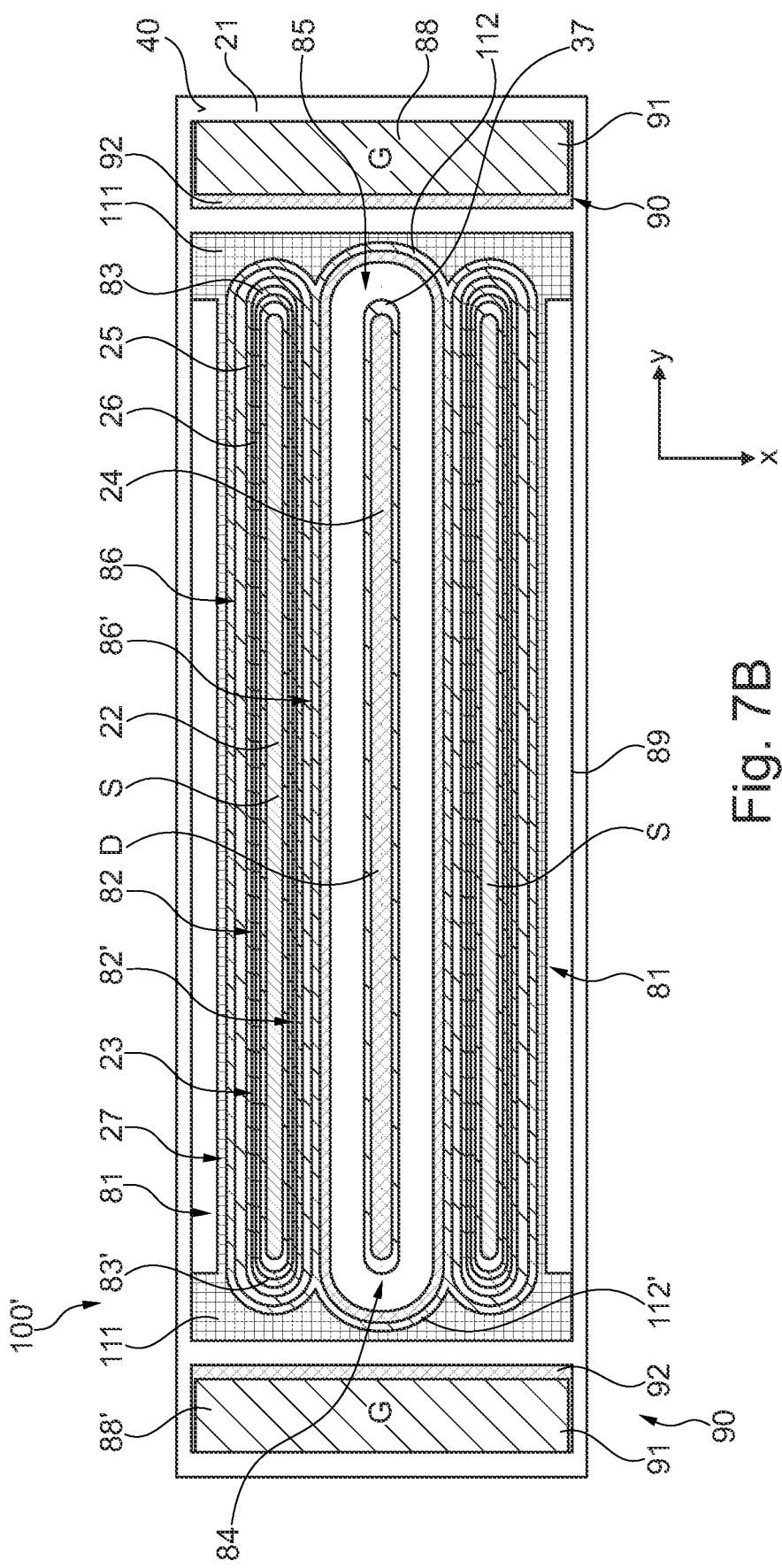
FIG. 7B illustrates top views of a Group III nitride transistor device according to an embodiment.
Figure 7C:
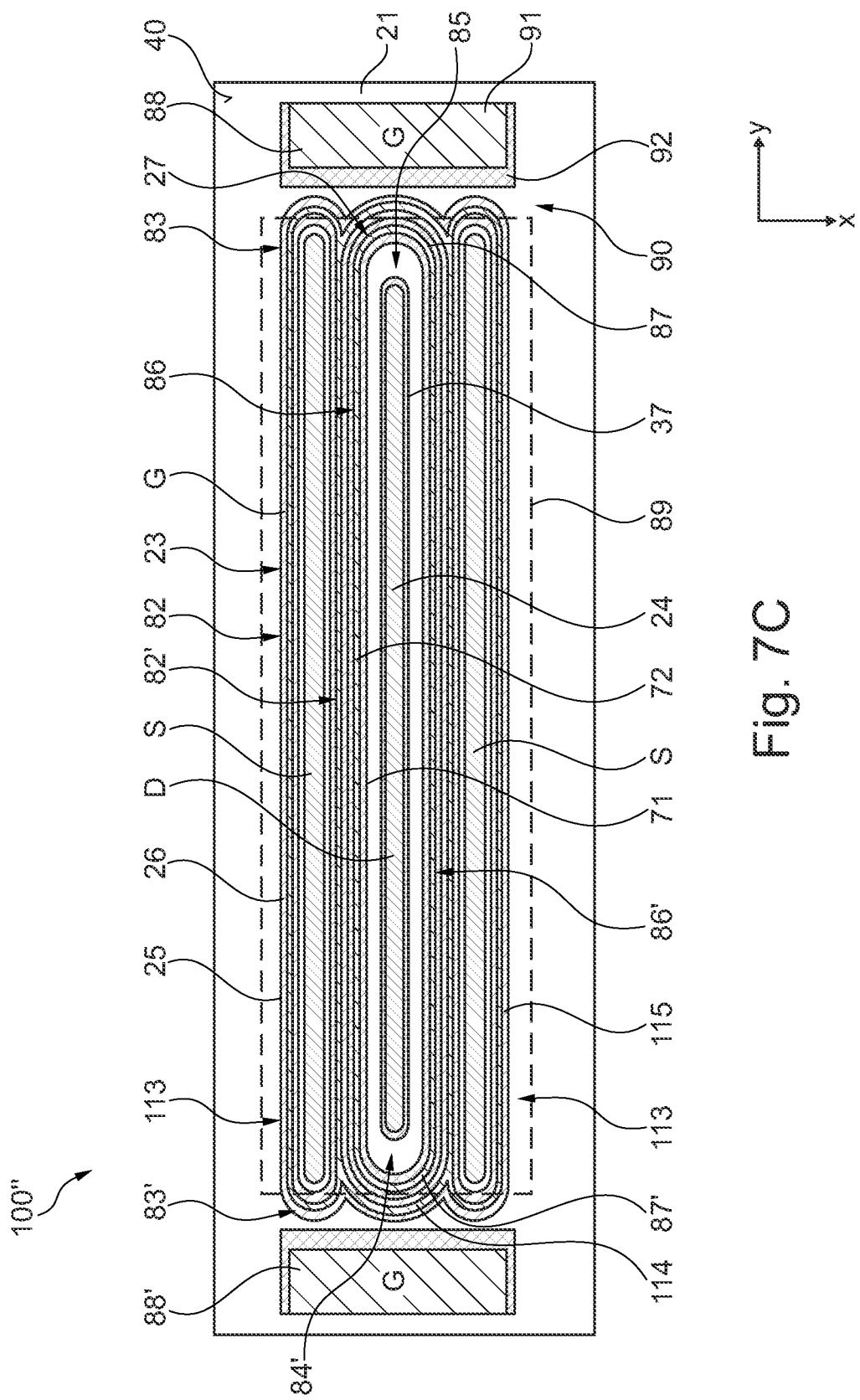
FIG. 7C illustrates top views of a Group III nitride transistor device according to an embodiment.

FIGS. 7A through 7C illustrate top views of a Group III nitride transistor device according to various embodiments, whereby two transistor cells are illustrated.

FIG. 7A illustrates a top view of two transistor cells 70" of a transistor device 100. The transistor cells 70" have the arrangement illustrated in FIG. 5C. The drain finger 24 is common to both cells 70" so that two source fingers 22 are arranged on opposing sides of the drain finger 24 and the source fingers 22 and the drain finger 24 extend substantially parallel to one another in the y direction. A gate finger 23 is positioned laterally adjacent the two opposing sides of each of the source fingers 22. The gate finger 23 has an elongate strip-like form in plan view and a length extending in the y direction and substantially parallel to the source finger 22 and the drain finger 24. Each gate finger has an elongate strip-like p-type Group III nitride finger 25 arranged in a recess 39 and an elongate strip-like metal gate finger 26 arranged on the p-type Group III nitride finger 25. The gate fingers 23 of both the cells 70" are electrically connected to one another by two gate buses 88, 88', whereby one gate bus is positioned laterally adjacent the opposing distal ends 84, 85 of the source fingers 22 and the drain finger 24. Each gate buss 88, 88' extends in the x direction and substantially perpendicularly to the length of the gate fingers 23.

The transistor device 100 also includes a protection diode 27 in each cell 70" that is positioned between the gate finger 23 and the drain finger 24. The protection diode 27 comprises an elongate strip-like shape and includes a p-type Group III nitride strip-like region 101 and a strip-like metal region 102 arranged on the p-type Group III nitride region 101. The protection diodes 27 extend substantially parallel to the gate electrode 23 in the y direction. One protection diode 27 is positioned laterally between each gate electrode 23 and the common drain finger 24.

As in the embodiment illustrated in FIG. 6C, the gate bus 88 also includes a p-type Group III nitride region 92 and a metal gate region 91 on the p-type Group III nitride region 92. The p-type Group III nitride region 92 is implanted or comprises a recess such that the region of the transistor device 100 underneath is normally off. The region of the transistor device 100 under the p-type Group III nitride region of the protection diode 27 is, however, normally on. The region of the transistor device 100 under the p-type Group III nitride drain region 37 is also normally on. The region of the Group III nitride body 21 of the transistor device 100 that is under the p-type Group III gate finger 25 is normally off in regions under the recess 39 and is normally on in regions laterally adjacent to the recess 39.

Not illustrated in FIG. 7A, is a source metal layer which electrically connects the source fingers 22 and the metal layer 72 of the protection diode 27 and a drain metal layer which is electrically connected to the drain finger 22. In some embodiments, the source metal layer and the drain metal layer provide contact pads or are connected to contact pads positioned in a further metallic layer of the metallization structure that is positioned above the source metal layer and drain metal layer. In both arrangements, the source and drain contact pads may be positioned above the active area 89 of the transistor device 100. A gate pad is electrically coupled to the gate busses 88, 88' which are arranged in the edge region 90. The gate pad may also be at least partially arranged in the edge region 90.

FIG. 7B illustrates a top view of a Group III nitride Group III nitride transistor device 100' and illustrates two cells 81 having a source finger 22 positioned on opposing sides of a common drain finger 24. The gate electrodes 23 and protection diode 27 of each cell 81 each have a continuous closed racetrack design as in the embodiment illustrated in FIG. 6A.

In this embodiment, the protection diodes 27 are electrically coupled to one another by at least one metallic connection trace 112. The metallic connection 112 may be a metallic connection trace and is positioned spaced apart from the distal end 84, 85 of the drain finger 24 and may have a curved form. One metallic connection trace 112 may be arranged adjacent each of the two distal ends 84, 85 of the drain finger 24. The two opposing curved sections 87, 87' of the protection diodes 27 and the connection trace 112 are positioned on a common p-type region 111 which does not affect the two-dimensional electron gas underneath so that this region of the Group III nitride body 21 of the transistor device 100' is normally on. However, in other embodiments, this region of the Group III nitride body 21 of the transistor device 100' is normally off.

In this embodiment, a gate bus 88, 88' is provided adjacent and spaced apart from the connection traces 112 and the opposing distal ends 84, 85 of the source fingers 22 and drain finger 24. The gate buses 88, 88' are spaced apart from the gate fingers 23 and each gate finger 23 is completely laterally surrounded by a respective protection diode 27. The gate buses 88, 88' are electrically connected to the gate fingers 23 by an additional metallic layer which is not shown in FIG. 7B. Again, the source metal layer, which is not shown in FIG. 7B, is electrically connected to the source fingers 22 and the metal of the protection diodes 27. A drain metal layer, which is not illustrated in FIG. 7B, is provided which is connected to the drain finger 24. The contact pads provided by the source metal layer and the drain metal layer may be positioned above the active area 89 of the transistor device 100'.

FIG. 7C illustrates a plan view of a Group III nitride transistor 100" and two transistor cells 113 which share a common drain finger 24. Each transistor cell 113 includes a source finger 22 arranged on opposing sides of the drain finger 24. Each gate finger 23 has a racetrack form and laterally surrounds and is spaced apart from the respective one of the source fingers 22. The gate fingers 23 are electrically coupled to one another by a connection trace 114 which is positioned adjacent and spaced apart from the two opposing distal ends 84, 85 of the drain finger 24. The connection trace 114 may have a curved form. A gate bus 88, 88' arranged adjacent and spaced apart from the opposing distal ends 84, 85 of the source fingers 22 and the drain finger 24.

In this embodiment, a protection diode 27 having a racetrack form is provided which is positioned such that it surrounds the drain finger 24 and such that one straight section 86, 86' is positioned between the respective straight sections 82, 82' racetrack gate finger 23 of the two transistor cells 113 and the drain finger 24. The curved sections 87, 87' of the protection diode 27 are arranged adjacent and spaced part from the opposing distal ends 85, 85 of the drain finger 24.

A p-type Group III nitride layer 115 is provided which extends under the metal gate electrode 26 and the connection traces 114 arranged laterally adjacent opposing distal ends 84, 85 of the drain finger 24. The p-type Group III nitride layer 115 depletes the two-dimensional electron gas in regions of the Group III nitride body 21 that are positioned under the recess 39 of the gate electrode 23.

The protection diode 27 has a race track form and laterally surrounds the drain finger 24. The p-type Group III nitride structure 71 that is positioned under the metal layer 72 of the protection diode 27 and at lateral positions between the metal of the protection diode 27 and the drain finger 24 fails to deplete the two-dimensional electron gas so that the region of the Group III nitride body 21 positioned under the p-type region 71 is normally on. As in the other embodiments, the p-type Group III nitride layer 37 of the drain finger 24 also fails to deplete the two-dimensional electron gas so that the region of the Group III nitride body 21 positioned under the p-type Group III nitride layer 37 is normally on. The gate buses 88, 88' also include a p-type Group III nitride layer 92 underneath the metal gate bus 91 which does deplete the underlying two-dimensional electron gas, for example by using recess or implantation.

Figure 8B:
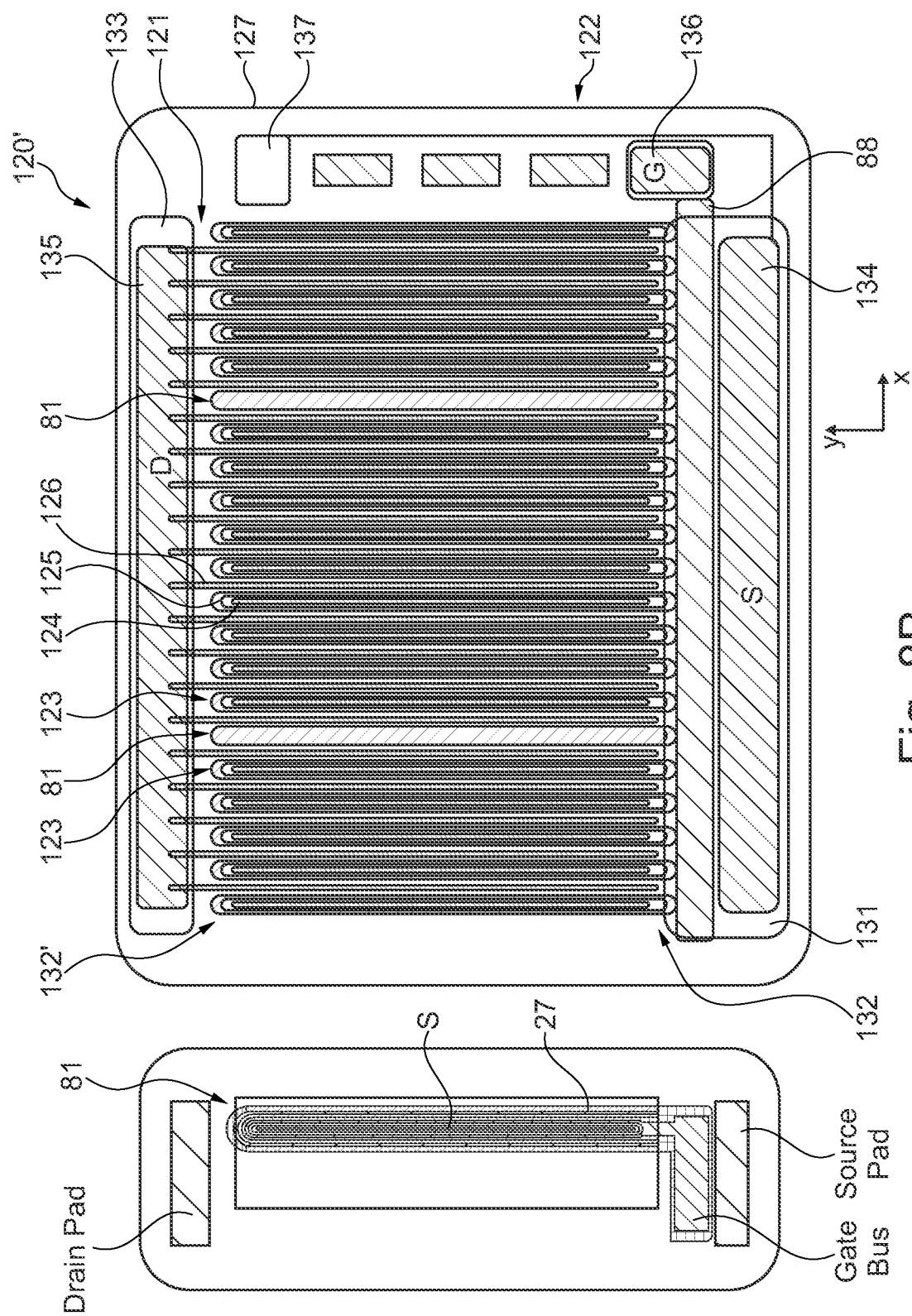
FIG. 8B illustrates a top view of a Group III nitride transistor device according to an embodiment.

The Group III nitride transistor cell with a protection diode according to any one of the embodiments described herein may be included at different positions within the Group III nitride transistor device. FIGS. 8A through 8C illustrate various embodiments of a Group III nitride transistor device including one or more transistor cells having a protection diode integrated into the cell structure.

FIG. 8A illustrates a top view of a Group III nitride transistor device 120 which includes a Group III nitride body 127 and an active area 121 that is laterally surrounded by an edge region 122. The active area 121 comprises a plurality of basic transistor cells 123. Each basic transistor cell 123 comprises a source finger 124, a gate finger 125 and a drain finger 126 positioned on the upper surface of the Group III nitride-based body 127 and extending substantially parallel to one another in the y-direction indicated in the plan view of FIGS. 8A through 8C. The gate finger 125 is arranged laterally between the source finger 124 and the drain finger 126. The gate finger 125 includes a p-type Group III nitride finger arranged on the Group III nitride body 127 and a gate metal finger arranged on the p-type Group III nitride finger, which cannot be seen in FIG. 8A. The p-type Group III nitride finger may be arranged in a gate recess formed in the upper surface that is not illustrated in the top view of FIG. 8A. Each of these basic transistor cells 123 provides a lateral transistor device structure.

The Group III nitride body 127 may comprise a substrate, which includes a growth surface which is capable supporting the epitaxial growth of at least one Group III nitride layer, a buffer structure arranged on the growth surface, a Group III nitride channel layer arranged on the buffer layer and a Group III nitride barrier layer arranged on the Group III nitride channel layer. In some embodiments, a transition layer is arranged between the growth surface and the buffer layer. The substrate may be formed of a material other than a Group III nitride, for example monocrystalline silicon or an epitaxial silicon layer, SiC or sapphire.

In addition to the plurality of basic transistor cells 123, the Group III nitride transistor device 120 includes at least one cell which comprises a protection diode integrated within the cell. As can be seen in the enlarged insert of FIG. 8A, the transistor cell 81 with the protection diode 27 is illustrated as having the structure illustrated and described with reference to FIG. 6C. However, the protection diode according to any one of the embodiments described herein may be used in place of this structure.

As can be seen in the plan view of FIG. 8A, the Group III nitride transistor device 120 comprises a plurality of transistor cells 81, each having a protection diode 27 which are positioned in a clamping region 129. The protection cells 81 extend substantially parallel to the basic transistor cells 123. The clamping region 129 is positioned laterally adjacent to the active area 121.

In some embodiments, the clamping region 129 is electrically isolated from the active area 121 by an isolation region 130 which may have the form of an implanted area and/or trench which may be filled with electrically insulating material. This embodiment may be used if the outermost finger of the outermost basic cell 123 of the active area 121 that is immediately laterally adjacent the clamping region 129 is a drain finger. If the outermost finger of the outermost basic cell 123 of the active area 121 that is immediately laterally adjacent the clamping region 129 is a source finger, the isolation region 130 may be omitted.

The source fingers 22 of both the protection cells 81 and the basic transistor cells 123 are electrically coupled to a source bus 131 which is positioned adjacent and spaced apart from a first distal end 132 of the source fingers 22. The drain fingers 24 of the protection cells 81 and of the basic transistor cells 123 are electrically coupled to a drain bus 133 that is positioned adjacent the opposing distal ends 132' of the source fingers 22. The gate fingers 23 of the protection cells 81 and of the basic transistor cells 123 are electrically coupled to a gate bus 88 which is positioned between the first distal ends 132 of the source fingers 22 and the source bus 131. Since the protection cells 81 having the protection diode 27 and the basic transistor cells 123 are electrically coupled to the same gate, source and drain buses 88, 131, 133, the cells 81 with the protection diode 27 are electrically coupled in parallel with and provide protection for the basic transistor cells 123 and the Group III nitride transistor device 120.

The transistor device 120 also has a source pad 134 arranged on the source bus 131, a drain pad 135 arranged on the drain bus 133 and a gate pad 136 which is arranged laterally adjacent to the gate bus 88 in the edge region 122. In some embodiments, a source sense pad 137 is also provided. The pads 134, 135, 136, 137 are arranged in the edge region 122.

FIG. 8B illustrates a top view of a Group III nitride transistor device 120' which also has an active area 121 that is laterally surrounded by an edge region 122 and which comprises a plurality of basic cells 123 and at least one cell 81 comprising a protective diode 27. In this embodiment, the protection cell 81 comprising the protective diode 27 is positioned in the active area 121 and is arranged between two basic transistor cells 123 which are without a protection diode. In FIG. 8B, two protective cells 81 comprising protective diodes 27 are illustrated in the active area 122. However, the Group III nitride transistor device 120' may include a single protective cell 81 with a protective diode 27 or more than two protective cells 81 with a protective diode 27. At least one basic cell 123 is arranged between the protection cells 81. The protection diode according to any one of the embodiments described herein may be used in place of this structure of the protective diode 81 described with reference to FIG. 6C.

FIG. 8C illustrates a plan view of a Group III nitride transistor device 120" which has an active area 121. In this embodiment, each of the cells 81 in the active area 121 comprises a protective diode 27. The protection diode according to any one of the embodiments described herein may be used in place of this structure of the protective diode 81 described with reference to FIG. 6C.

Figure 9:
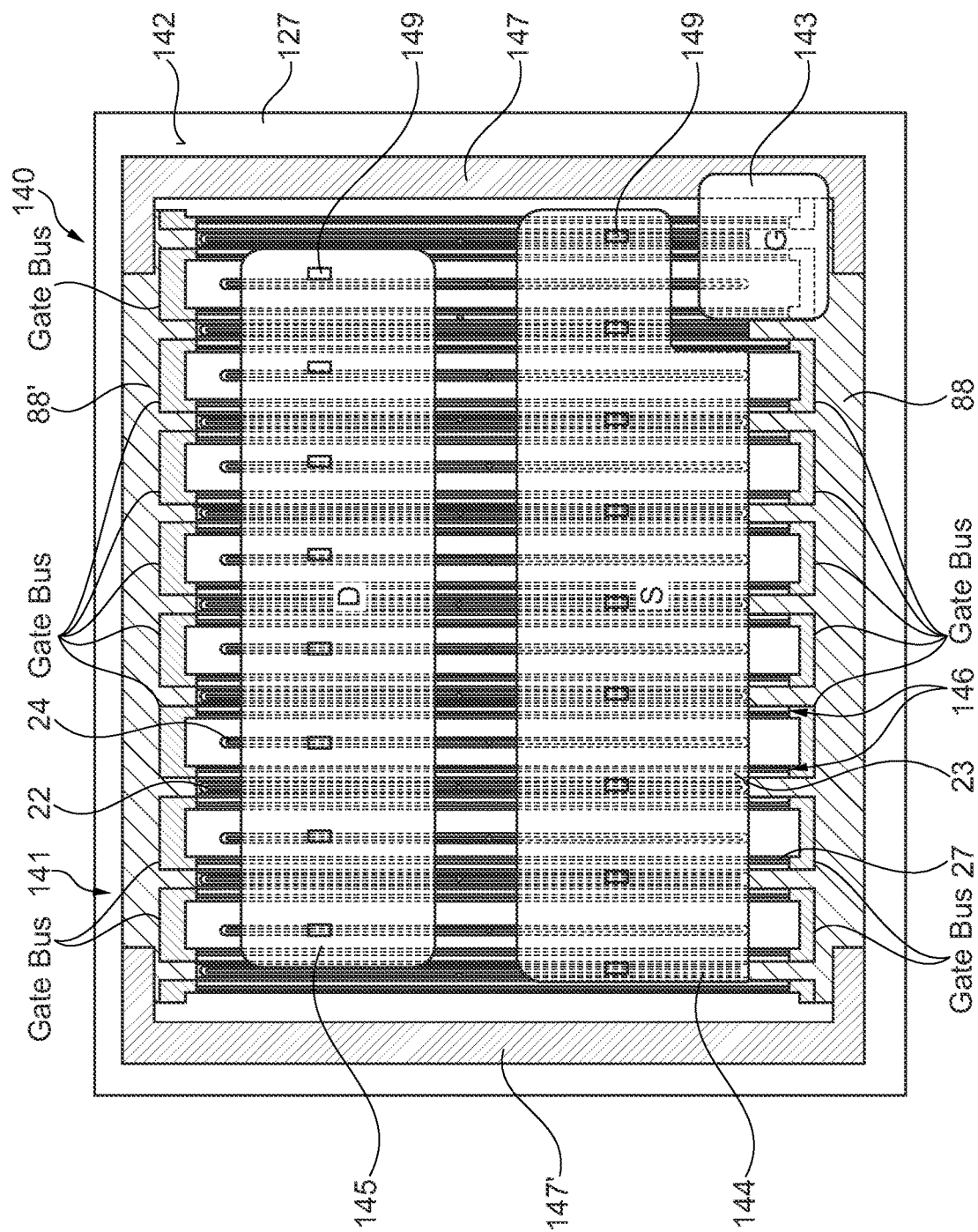
FIG. 9 illustrates a top view of a Group III nitride transistor device according to an embodiment.

FIG. 9 illustrates a top view of a Group III nitride transistor device 140 and illustrates the outermost contact pads of the metallisation structure 141 that is arranged on the upper surface 142 of the Group III nitride body 127 above the active area 122. The active area 122 includes a plurality of transistor cells 146 and one or more protection cells according to any one of the embodiments described herein. The metallisation structure 141 provides a gate pad 143, a source pad 144 and a drain pad 145. The source pad 144 and the drain pad 145 are positioned vertically above the transistor cells 146 and on the active area 121 of the Group III nitride transistor device 140. The gate pad 143 is also positioned at least partially above the active area toward one corner of the upper surface 142. In this embodiment, the gate fingers 23 of the transistor cells 146 extend into gate buses 88, 88' positioned adjacent to the two opposing distal ends 84, 85 of the source and drain fingers 22, 24.

The gate buses 88, 88' are electrically coupled to one another and to the gate pad 143 by additional buses 147, 147' which extend in the y direction in the edge region between the opposing sides of the gate buses 88, 88'. Since, the source pad 143 is positioned above the source fingers 22, the individual source fingers 22 can be electric coupled to the source pad 143 by one or more conductive vias 148. Similarly, the individual drain fingers 24 may be coupled to the drain pad 144 by one or more vertical conductive vias 149. In this embodiment one, some or all of the cells 146 may include a protection diode 27. In some embodiments, the transistor cell 146 may have the structure of the transistor cells 70" described with reference to FIG. 7A.

The following examples are also provided.

Example 1. A Group III nitride transistor cell (70), comprising: a Group III nitride-based body (21); a source finger (22), a gate finger (23) and a drain finger (24) extending substantially parallel to one another and positioned on the Group III nitride-based body (21), the gate finger (23) being arranged laterally between the source finger (22) and the drain finger (24) and comprising a p-type Group III nitride finger (25) arranged on the Group III nitride body (21) and a gate metal finger (26) arranged on the p-type Group III nitride finger (25); a protection diode (27) integrated into the Group III nitride transistor cell (70) that is operable to conduct current in a reverse direction when the Group III nitride transistor cell (70) is switched off, wherein the protection diode (27) is electrically coupled between the source finger (22) and the drain finger (24) and is positioned on the Group III nitride body (21) laterally between and spaced apart from the gate finger (23) and the drain finger (24).

Example 2. A Group III nitride transistor cell (70) according to example 1, wherein the protection diode (27) comprises a Group III nitride island (71) that is positioned laterally between and spaced apart from the gate finger (23) and the drain finger (24) and a metal island (72) that is arranged on the Group III nitride island (71).

Example 3. A Group III nitride transistor cell (70) according to example 2, wherein the metal island (72) is electrically coupled to the source finger (22) by a source metal layer (34) that extends from the source finger (22) over the gate finger (23) to the metal island (72), wherein the source metal layer (34) is electrically insulated from the gate finger (23).

Example 4. A Group III nitride transistor cell (70) according to example 2 or example 3, wherein the metal island (72) extends onto the Group III nitride body (21) at a position between the Group III nitride island (71) and the gate finger (23).

Example 5. A Group III nitride transistor cell (70) according to one of examples 1 to 4, wherein in plan view the gate finger (23) has a first straight section (73) and a second straight section (74) and a bent section (74) that is positioned between the first and second straight sections (73, 74) and has a base (76) that is positioned at a greater distance from the drain finger (24) than the first and second straight sections (73, 74).

Example 6. A Group III nitride transistor cell (70) according to one of examples 1 to 5, wherein the metal island (72) of the protection diode forms an ohmic contact or a Schottky contact to the Group III nitride island (71).

Example 7. A Group III nitride transistor cell (70) according to one of examples 1 to 6, wherein the protection diode (27) comprises a plurality of discrete sections (75) spaced apart at intervals and forming a row that is substantially parallel to the source finger (24).

Example 8. A Group III nitride transistor cell according to example 1 or example 7, wherein the protection diode (27) comprises a Schottky metal layer (72) positioned directly on the Group III nitride body (21).

Example 9. A Group III nitride transistor cell (70) according to one of examples 2 to 5, wherein the protection diode (27) is elongate such that the Group III nitride island (71) and the metal island (72) each have the form of a finger that extends substantially parallel to the drain finger (24).

Example 10. A Group III nitride transistor cell (70) according to one of examples 3 to 9, wherein the source metal layer (34) and/or the metal island (72) further comprises a first extension (35, 77) positioned at a distance from the Group III nitride island (72) and the Group III nitride body-based body (21) and extending towards the drain finger (24), the first extension (35, 77) forming a field plate.

Example 11. A Group III nitride transistor cell (70) according to example 10, wherein the source metal layer (34) and/or the metal island (72) further comprises a second extension (35, 77) extending from the first extension towards the drain finger (24) and positioned at a distance from the first extension (77, 35) and the Group III nitride-based body (21).

Example 12. A Group III nitride transistor cell (70) according to one of examples 1 to 11, wherein the gate finger (23) further comprises a gate recess (39) in the Group III nitride-based body (21) and the p-type Group III nitride finger (26) has a T-shape in cross-section.

Example 13. A Group III nitride transistor device (80; 100; 100'; 100"; 120; 140), comprising an active area (121) comprising a plurality of basic cells (123), each basic cell (123) comprising a source finger, a gate finger and a drain finger extending substantially parallel to one another and positioned on a Group III nitride-based body (127), the gate finger being arranged laterally between the source finger and the drain finger and comprising a p-type Group III nitride finger arranged on the Group III nitride body and a gate metal finger arranged on the p-type Group III nitride finger and at least one cell (70) according to one of examples 1 to 12, wherein the at least one cell (70; 81) is arranged in a clamping region (129) that is laterally adjacent the active region (121), or the at least one cell (70; 81) is arranged between basic cells (123) in the active area (121).

Example 14. A Group III nitride transistor device (80) according to example 13, wherein the gate finger 23 comprises two straight sections (82, 82') and two curved sections (83, 83') that form a loop that laterally surrounds a source finger (22) and the protection diode (27) has a U-shape and laterally surrounds the loop.

Example 15. A Group III nitride transistor device (80; 120) according to example 13 or example 14, further comprising a gate bus (88, 88') and a source bus (94) arranged laterally adjacent a first distal end (85) of the source and drain fingers (22, 24) and a drain bus (93) arranged laterally adjacent the opposing second distal end (84) of the source and drain fingers (22, 24), wherein the gate bus (88) is integral with the gate fingers (23).

Example 16. A Group III nitride transistor device (100) according to example 13 or example 14, further comprising a first gate bus (88) arranged laterally adjacent the first distal end (85) and a second gate bus (88') arranged laterally adjacent the second distal end (84) of the source and drain fingers (22, 24), wherein the first and second gate buses (88, ((') are integral with the gate fingers (23), or spaced apart from the gate fingers (23).

Example 17. A Group III nitride transistor device (100'; 100") according to example 16, wherein the gate finger (23) comprises a loop that laterally surrounds a source finger (22), and wherein the protection diode (27) has form of a loop surrounding the loop of the gate finger (23) and neighbouring protection diodes (27) are coupled by connections (112, 112') positioned adjacent the first and second distal ends (84, 85) of the drain finger (24), or the protection diode (27) has form of a loop surrounding the drain finger (24) and neighbouring loops of gate fingers (23) are coupled by connections (114, 114') positioned adjacent the distal ends of protection diode (87, 87').

Example 18. A Group III nitride transistor device (140) according to any one of examples 15 to 17, wherein a source pad (144) and a drain pad (145) are arranged over the active area (122).

Example 19. A Group III nitride transistor cell (20; 50; 60), comprising: a Group III nitride-based body (21); a source finger (22), a gate finger (23) and a drain finger (24) extending substantially parallel to one another and positioned on the Group III nitride-based body (21), the gate finger (23) being arranged laterally between the source finger (23) and the drain finger (24) and comprising a p-type Group III nitride finger (25) arranged on the Group III nitride body (21) and a gate metal finger (26) arranged on and forming an ohmic contact or a Schottky contact with the p-type Group III nitride finger (25); a protection diode (27) integrated into the Group III nitride transistor cell (20) that is operable to conduct current in a reverse direction when the Group III nitride transistor cell (20) is switched off, wherein the gate finger (23) comprises a switching section (28) and a protection section (29), wherein the protection section (29) is arranged intermediate the length of the gate finger (23), and in the protection section (29) of the gate finger (23) the p-type Group III nitride finger (25) is electrically coupled to the source finger (22) by a connection layer (30) extending on the Group III nitride-based body (21) between the p-type Group III nitride finger (25) and the source finger (22), wherein in the protection section (29) the metal gate finger (26) is electrically insulated from the connection layer (30).

Example 20. A Group III nitride transistor cell (20; 50; 60) according to example 19, further comprising two isolation regions (32, 33) spaced apart along the length of the gate finger (23) and arranged such that the p-type Group III nitride finger (25) in the protection section (29) is electrically insulated from the p-type Group III nitride finger (25) in the switching section (28).

Example 21. A Group III nitride transistor cell (20; 60) according to example 19 or example 20, wherein the metal gate finger (26) is continuous throughout the switching section (28) and the protection section (29) and in the protection section (29) is positioned above and is electrically insulated from the connection layer (30).

Example 22. A Group III nitride transistor cell (50) according to example 19 or example 20, wherein the gate metal finger (26'; 26") is positioned only in the switching section (28) and the Group III nitride finger (25) extends continuously throughout the switching section (28) and the protection section (29), wherein in the protection section (29) the p-type Group III nitride finger (25) is electrically coupled to the source finger (22) by the connection layer (30).

Example 23. A Group III nitride transistor cell (50) according to example 19 or example 20, wherein the Group III nitride finger (25) comprises two or more discrete sections, wherein a first section (25') is positioned in the switching section (28') and a second section (25") is positioned in the protection section (29) and spaced apart from the first section (25'), wherein the gate metal finger (26') is positioned only in the switching section (28') and the Group III nitride finger (25) extends continuously throughout the switching section (28) and the protection section (29), wherein in the protection section (29) the second section (25") of the p-type Group III nitride finger (25) is electrically coupled to the source finger (22) by the connection layer (30).

Example 24. A Group III nitride transistor cell (50) according to example 22 or example 23, wherein the gate finger (23) comprises a further switching section (28") and a further gate metal finger (26'), wherein the metal gate finger (26') and the further gate finger (26") are electrically connected by a gate connection layer.

Example 25. A Group III nitride transistor cell (20; 50; 60) according to any one of examples 22 to 24, wherein the connection layer (30) forms an ohmic contact or a Schottky contact to the Group III nitride body (21).

Example 26. A Group III nitride transistor cell (20) according to one of examples 19 to 21, wherein the connection layer (30) forms a Schottky contact to the Group III nitride gate finger (25).

Example 27. A Group III nitride transistor cell (20) according to example 26, wherein the gate metal finger (26) is continuous throughout the switching section (28) and the protection section (29), wherein in the protection section (29) the gate metal finger (26) is electrically insulated from the connection layer (30) that extends between the p-type Group III nitride finger (25) and the source finger (22).

Example 28. A Group III nitride transistor cell (20) according to one of examples 19 to 27, further comprising a source metal layer (34) arranged on the source finger (22), the source metal layer (34) extending over and being electrically insulated from the gate finger (26), and a drain metal layer (36) arranged on the drain finger (24).

Example 29. A Group III nitride transistor cell (20; 50; 60) according to one of examples 19 to 28, further comprising a dielectric layer (46, 51) arranged between a side face of the source finger (22) and the connection layer (30).

Example 30. A Group III nitride transistor cell (20; 50; 60) according to example 29, wherein the dielectric layer (46) extends from the source finger to the p-type Group III nitride finger or the dielectric layer (51) is spaced apart from the p-type Group III nitride finger (25).

Example 31. A Group III nitride transistor cell (20; 50; 60) according to example 29 or example 30, wherein in the protection section (29), the p-type Group III nitride finger (25) is electrically coupled to the source finger (22) by the connection layer (30), wherein the connection layer extends (30) between the p-type Group III nitride finger (25) and a source metal layer (34) that is arranged on the dielectric layer (46, 51) and on the source finger (22).

Example 32. A Group III nitride transistor cell (20; 50; 60) according to one of examples 19 to 31, wherein the drain finger (24) further comprises a p-type region (37) that is coupled to the drain finger (24).

Example 32. A Group III nitride transistor cell (20; 50; 60) according to any one of examples 19 to 31, wherein the protection diode (27) comprises a gated diode structure, whereby the gate metal finger (26) is electrically coupled to the source finger (22) and provides an anode and the drain finger (24) provides a cathode.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Group III nitride transistor cell, comprising:
    a Group III nitride-based body;
    a source finger, a gate finger and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on the p-type Group III nitride finger; and
    a protection diode integrated into the Group III nitride transistor cell and operable to conduct current in a reverse direction when the Group III nitride transistor cell is switched off,
    wherein the protection diode is electrically coupled between the source finger and the drain finger and is positioned on the Group III nitride body laterally between and spaced apart from the gate finger and the drain finger,
    wherein the protection diode comprises a Group III nitride island that is positioned laterally between and spaced apart from the gate finger and the drain finger and a metal island that is arranged on the Group III nitride island,
    wherein the metal island is electrically coupled to the source finger by a source metal layer that extends from the source finger over the gate finger to the metal island,
    wherein the source metal layer is electrically insulated from the gate finger,
    wherein the source metal layer and/or the metal island further comprises a first extension positioned at a distance from the Group III nitride island and the Group III nitride body-based body and extending towards the drain finger, the first extension forming a field plate.

2. The Group III nitride transistor cell of claim 1, wherein the source metal layer and/or the metal island further comprises a second extension extending from the first extension towards the drain finger and positioned at a distance from the first extension and the Group III nitride-based body.

3. The Group III nitride transistor cell of claim 1, wherein the metal island extends onto the Group III nitride body at a position between the Group III nitride island and the gate finger.

4. The Group III nitride transistor cell of claim 1, wherein the metal island of the protection diode forms an ohmic contact or a Schottky contact to the Group III nitride island.

5. The Group III nitride transistor cell of claim 1, wherein the protection diode is elongate such that the Group III nitride island and the metal island each have the form of a finger that extends substantially parallel to the drain finger.

6. The Group III nitride transistor cell of claim 1, wherein in plan view, the gate finger has a first straight section, a second straight section, and a bent section that is positioned between the first and second straight sections and has a base that is positioned at a greater distance from the drain finger than the first and second straight sections.

7. The Group III nitride transistor cell of claim 1, wherein the protection diode comprises a plurality of discrete sections spaced apart at intervals and forming a row that is substantially parallel to the source finger.

8. The Group III nitride transistor cell of claim 1, wherein the gate finger further comprises a gate recess in the Group III nitride-based body and the p-type Group III nitride finger has a T-shape in cross-section.

9. A Group III nitride transistor cell, comprising:
    a Group III nitride-based body;
    a source finger, a gate finger and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on the p-type Group III nitride finger; and
    a protection diode integrated into the Group III nitride transistor cell and operable to conduct current in a reverse direction when the Group III nitride transistor cell is switched off,
    wherein the protection diode is electrically coupled between the source finger and the drain finger, and is positioned on the Group III nitride body laterally between and spaced apart from the gate finger and the drain finger,
    wherein the protection diode comprises a Group III nitride island that is positioned laterally between and spaced apart from the gate finger and the drain finger, and a metal island that is arranged on the Group III nitride island,
    wherein the protection diode is elongate such that the Group III nitride island and the metal island each have the form of a finger that extends substantially parallel to the drain finger.

10. A Group III nitride transistor cell, comprising:
    a Group III nitride-based body;
    a source finger, a gate finger and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on the p-type Group III nitride finger; and
    a protection diode integrated into the Group III nitride transistor cell and operable to conduct current in a reverse direction when the Group III nitride transistor cell is switched off,
    wherein the protection diode is electrically coupled between the source finger and the drain finger and is positioned on the Group III nitride body laterally between and spaced apart from the gate finger and the drain finger,
    wherein the protection diode comprises a Schottky metal layer positioned directly on the Group III nitride body.

11. A Group III nitride transistor cell, comprising:
    a Group III nitride-based body;
    a source finger, a gate finger and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on the p-type Group III nitride finger; and a protection diode integrated into the Group III nitride transistor cell and operable to conduct current in a reverse direction when the Group III nitride transistor cell is switched off, wherein the protection diode is electrically coupled between the source finger and the drain finger and is positioned on the Group III nitride body laterally between and spaced apart from the gate finger and the drain finger, wherein the gate finger further comprises a gate recess in the Group III nitride-based body and the p-type Group III nitride finger has a T-shape in cross-section.

12. A Group III nitride transistor device, comprising:
a Group III nitride-based body;
an active area comprising a plurality of basic cells, each basic cell comprising a source finger, a gate finger, and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on the p-type Group III nitride finger;
at least one Group III nitride transistor cell comprising a source finger, a gate finger and a drain finger extending substantially parallel to one another and positioned on the Group III nitride-based body, the gate finger being arranged laterally between the source finger and the drain finger and comprising a p-type Group III nitride finger arranged on the Group III nitride body and a gate metal finger arranged on the p- type Group III nitride finger; and
a protection diode integrated into the at least one Group III nitride transistor cell and operable to conduct current in a reverse direction when the at least one Group III nitride transistor cell is switched off,
wherein the protection diode is electrically coupled between the source finger and the drain finger of the at least one Group III nitride transistor cell and is positioned on the Group III nitride body laterally between and spaced apart from the gate finger and the drain finger of the at least one Group III nitride transistor cell,
wherein the at least one Group III nitride transistor cell is arranged in a clamping region that is laterally adjacent the active region, or the at least one Group III nitride transistor cell is arranged between basic cells in the active area.

13. The Group III nitride transistor device of claim 12, wherein the gate finger of the at least one Group III nitride transistor cell comprises two straight sections and two curved sections that form a loop that laterally surrounds the source finger of the at least one Group III nitride transistor cell, and wherein:
the protection diode has a U-shape and laterally surrounds the loop of the gate finger of the at least one Group III nitride transistor cell; or
the protection diode has form of a loop surrounding the loop of the gate finger of the at least one Group III nitride transistor cell and neighbouring protection diodes are coupled by connections positioned adjacent opposing first and second distal ends of the drain finger of the at least one Group III nitride transistor cell; or
the protection diode has a form of a loop surrounding the drain finger of the at least one Group III nitride transistor cell and neighbouring loops of gate fingers are coupled by connections positioned adjacent opposing distal ends of the protection diode.

14. The Group III nitride transistor device of claim 12, further comprising:
a gate bus and a source bus arranged laterally adjacent a first distal end of the source finger and the drain finger of the at least one Group III nitride transistor cell; and
a drain bus arranged laterally adjacent an opposing second distal end of the source finger and the drain finger of the at least one Group III nitride transistor cell,
wherein the gate bus is integral with the gate finger of the at least one Group III nitride transistor cell.

15. The Group III nitride transistor device of claim 12, further comprising:
a first gate bus arranged laterally adjacent a first distal end of the source finger and the drain finger of the at least one Group III nitride transistor cell; and
a second gate bus arranged laterally adjacent an opposing second distal end of the source finger and the drain finger of the at least one Group III nitride transistor cell,
wherein the first and second gate buses are integral with the gate finger of the at least one Group III nitride transistor cell, or spaced apart from the gate finger of the at least one Group III nitride transistor cell.

* * * * *